United States Patent
Sakai

(10) Patent No.: US 7,251,153 B2
(45) Date of Patent: Jul. 31, 2007

(54) MEMORY

(75) Inventor: Naofumi Sakai, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/024,688

(22) Filed: Dec. 30, 2004

(65) Prior Publication Data

US 2005/0152193 A1    Jul. 14, 2005

(30) Foreign Application Priority Data

Jan. 14, 2004    (JP)    ............................. 2004-006396

(51) Int. Cl.
*G11C 11/22* (2006.01)
(52) U.S. Cl. .................. 365/145; 365/189.04; 365/227
(58) Field of Classification Search .................. 365/145
See application file for complete search history.

(56) References Cited

U.S. PATENT DOCUMENTS

| | | | |
|---|---|---|---|
| 5,550,770 A | | 8/1996 | Kuroda |
| 6,147,903 A | * | 11/2000 | Takahashi .............. 365/185.05 |
| 6,356,475 B1 | | 3/2002 | Tamura et al. |
| 6,473,329 B1 | | 10/2002 | Nakamura |
| 6,515,889 B1 | * | 2/2003 | Salling et al. .............. 365/145 |
| 6,522,572 B2 | | 2/2003 | Nakamura |
| 6,587,365 B1 | * | 7/2003 | Salling ...................... 365/145 |
| 6,795,351 B2 | | 9/2004 | Sakai |
| 2004/0022090 A1 | * | 2/2004 | Hasegawa et al. .......... 365/199 |
| 2004/0105297 A1 | * | 6/2004 | Takano ...................... 365/145 |
| 2004/0109363 A1 | * | 6/2004 | Hamada ..................... 365/200 |

FOREIGN PATENT DOCUMENTS

| | | |
|---|---|---|
| JP | 06-077434 A | 3/1994 |
| JP | 09-116107 A | 5/1997 |
| JP | 10-162587 A | 6/1998 |
| JP | 2001-210795 | 8/2001 |
| KR | 2001-0031598 | 4/2001 |
| KR | 2003-0076377 | 9/2003 |
| WO | 99/26252 | 5/1999 |

OTHER PUBLICATIONS

Sakai et al., "A Novel Access Scheme Suppressing Disturbance for a Cross-Point Type Ferroelectric Memory", Symposium on VLSI Circuits Digest of Technical Papers, Session 13-2, p. 171-173 (Jun. 2003).

* cited by examiner

*Primary Examiner*—Thong Q. Le
(74) *Attorney, Agent, or Firm*—Arent Fox, LLP.

(57) ABSTRACT

A memory capable of suppressing disturbance causing disappearance of data from a nonselected memory cell is provided. This memory applies a second voltage of polarity reverse to that of a first voltage applied to a nonselected memory cell in a read operation to at least the nonselected memory cell in addition to the read operation collectively performed on all memory cells connected to a selected word line.

20 Claims, 34 Drawing Sheets

FIG.10
FOURTH CELL REGION
CELL HAVING HELD "0"
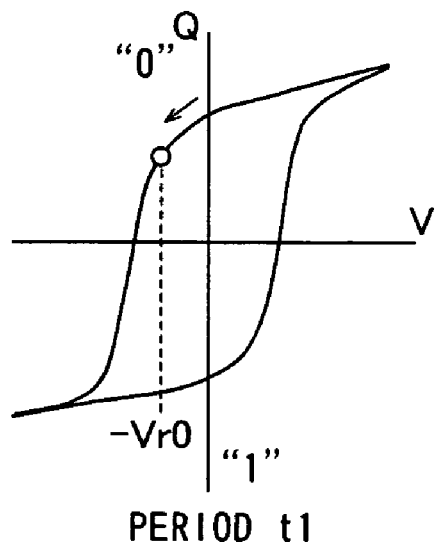
PERIOD t1
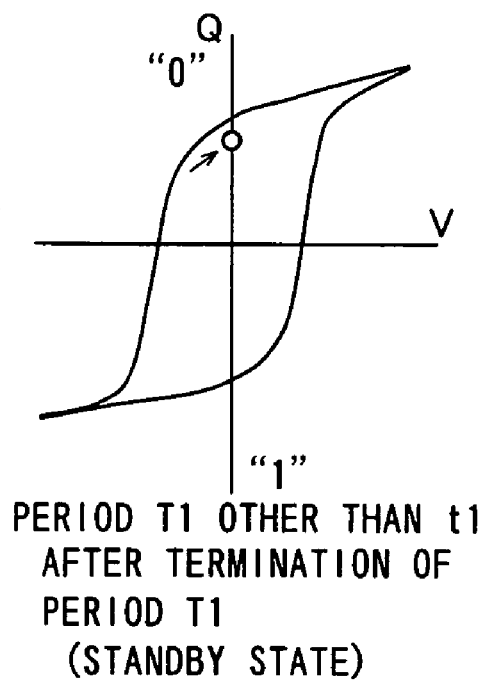
PERIOD T1 OTHER THAN t1
AFTER TERMINATION OF
PERIOD T1
(STANDBY STATE)
CELL HAVING HELD "1"
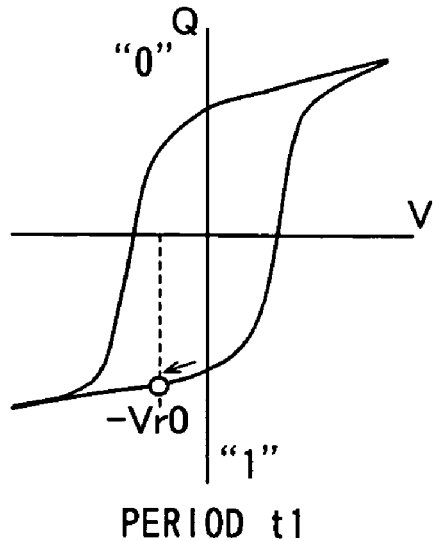
PERIOD t1
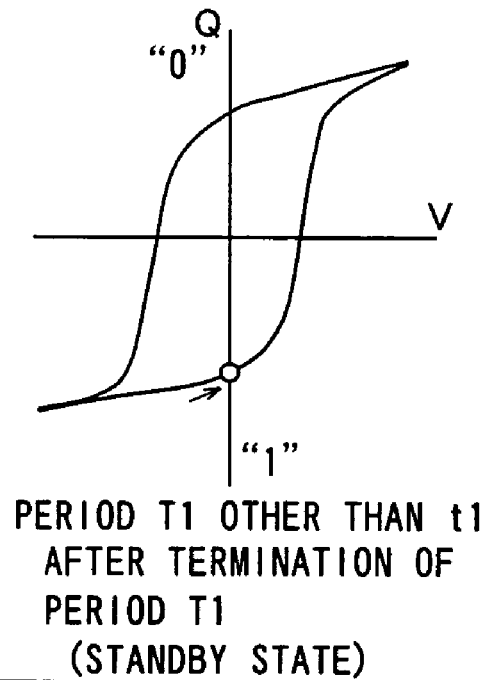
PERIOD T1 OTHER THAN t1
AFTER TERMINATION OF
PERIOD T1
(STANDBY STATE)

MEMORY

BACKGROUND OF THE INVENTION

1. Field of the Invention

The present invention relates to a memory, and more particularly, it relates to a memory comprising a memory cell array including memory cells holding data.

2. Description of the Background Art

In general, volatile and nonvolatile memories are known as semiconductor memories. A DRAM (dynamic random access memory) is known as the volatile memory, while a flash EEPROM (electrically erasable and programmable read only memory) is known as the nonvolatile memory. The DRAM and the flash EEPROM allowing high integration are widely used.

FIG. 38 is an equivalent circuit diagram showing the structure of each memory cell 103 of a conventional DRAM. FIG. 39 is a sectional view showing a trench-type capacitor employed in the conventional DRAM. Referring to FIG. 38, the memory cell 103 of the DRAM employed as the conventional volatile memory is constituted of a selection transistor 101 and a capacitor 102. The capacitor 102 stores information of the memory cell 103 in the form of charges. In order to read the information from the memory cell 103, a word line WL rises to turn on the selection transistor 101, thereby capacitively coupling a cell capacitance Ccell and a bit line capacitance Cbl with each other. Thus, a bit line potential decided by the quantity of charges stored in the memory cell 103 can be read.

In order to ensure the cell capacitance Ccell of the capacitor 102 in the memory cell 103 of the conventional DRAM having the aforementioned structure also when the DRAM is refined, the trench type capacitor formed by vertically elongating an upper electrode 102a, a lower electrode 102c and a dielectric film 102b constituting the capacitor 102 is employed as shown in FIG. 39. When the conventional DRAM is further refined, however, it is difficult to ensure the cell capacitance Ccell of the capacitor 102 by employing the trench type capacitor shown in FIG. 39. In other words, integration of the DRAM through reduction of the design rule is approaching the limit.

In the flash EEPROM (hereinafter referred to as a flash memory) employed as the nonvolatile memory, a stacked or split gate memory cell of a CHE (channel hot electron) write system is limited in refinement of the channel length. In a memory cell of an FN (Fowler-Nordheim) write system such as a NAND type memory cell, the limit of refinement is equivalent to that of a logic transistor. However, the flash memory requires a high voltage of 15 V to 20 V for operation, and reduction of a power supply voltage for the logic transistor leads to reduction of efficiency for forming the high voltage of 15 V to 20 V from the low power supply voltage. Therefore, power consumption as well as the area of a charge pumping part are increased to disadvantageously inhibit the refinement.

On the other hand, a ferroelectric memory is known as one of recently noted nonvolatile memories, as disclosed in Japanese Patent Laying-Open No. 2001-210795, for example. This ferroelectric memory utilizes pseudo capacitance change responsive to the direction of polarization of a ferroelectric substance as a memory element. This ferroelectric memory, capable of rewriting data at a high speed with a low voltage in principle, is spotlighted as an ideal memory having both of the advantages of the DRAM and the flash memory, i.e., high-speed low-voltage operability and nonvolatility.

Memory cell systems for a ferroelectric memory are roughly classified into three types, i.e., a one-transistor one-capacitor system, a simple matrix system and a one-transistor system. FIG. 40 is an equivalent circuit diagram showing a memory cell 113 of a one-transistor one-capacitor ferroelectric memory. FIG. 41 is an equivalent circuit diagram showing a memory cell array of a simple matrix ferroelectric memory. FIG. 42 is a hysteresis diagram for illustrating operations of the simple matrix ferroelectric memory, and FIG. 43 is a hysteresis diagram for illustrating disturbance in the simple matrix ferroelectric memory. FIG. 44 is an equivalent circuit diagram showing memory cells 131 of a one-transistor ferroelectric memory.

As shown in FIG. 40, the memory cell 113 of the one-transistor one-capacitor ferroelectric memory is constituted of a selection transistor 111 and a dielectric capacitor 112, similarly to the memory cell 103 of the DRAM. The memory cell 113 is different from the memory cell 103 in a point that the same has the ferroelectric capacitor 112. In operation, a word line WL rises to turn on the selection transistor 111, thereby connecting a capacitance Ccell of the ferroelectric capacitor 112 and a bit line capacitance Cbl with each other. Then, a plate line PL is pulse-driven to feed charges to a bit line BL in a quantity varying with the direction of polarization of the ferroelectric capacitor 112. Data is read as the potential difference of the bit line BL, similar to the case of the DRAM.

In this one-transistor one-capacitor ferroelectric memory, the ferroelectric capacitor 112 is limited in refinement due to the structure similar to the memory cell 103 of the DRAM. Therefore, the one-transistor one-capacitor ferroelectric memory is limited in integration similarly to the DRAM.

The simple matrix ferroelectric memory is now described with reference to FIGS. 41 to 43. Each memory cell 121 of the simple matrix ferroelectric memory is constituted of a ferroelectric capacitor 122 consisting of a corresponding word line WL and a corresponding bit line BL extending to intersect with each other and a ferroelectric film (not shown) arranged between the word line WL and the bit line BL. First and second ends of the ferroelectric capacitor 122 are connected to the word line WL and the bit line BL respectively. This simple matrix ferroelectric memory, reading a potential resulting from capacitive coupling between the bit line BL and the ferroelectric capacitor 122, must ensure a capacitance similarly to the DRAM. However, the memory cell 121 is constituted of only the ferroelectric capacitor 122 with no selection transistor, whereby the simple matrix ferroelectric memory can be improved in degree of integration as compared with the one-transistor one-capacitor ferroelectric memory.

Operations of the simple matrix ferroelectric memory are now described with reference to FIGS. 42 and 43. Table 1 shows voltages applied to each memory cell 121 in reading and writing.

TABLE 1

|  | Standby | Read | Write "1" | Write "0" |
|---|---|---|---|---|
| Selected WL | ½ Vcc | Vcc | 0 | Vcc |
| Nonselected WL | ½ Vcc | ⅓ Vcc | ⅔ Vcc | ⅓ Vcc |
| Selected BL | ½ Vcc | 0 → Floating | Vcc | 0 |
| Nonselected BL | ½ Vcc | ⅔ Vcc | ⅓ Vcc | ⅔ Vcc |

In a write operation, both ends of each ferroelectric capacitor 122 are at the same potential in a standby state. In order to write data "0" in any memory cell 121, the ferroelectric memory applies Vcc and 0 V to the corresponding word line WL and the corresponding bit line BL respectively. At this time, the ferroelectric memory applies a potential difference Vcc to the ferroelectric capacitor 122. Thus, the ferroelectric memory makes a transition to a point A in FIG. 42. Thereafter the ferroelectric memory sets both ends of the ferroelectric capacitor 122 to the same potential, thereby making a transition to a point "0" in FIG. 42. In order to write data "1", on the other hand, the ferroelectric memory applies 0 V and Vcc to the word line WL and the bit line BL respectively. At this time, the ferroelectric memory applies a potential difference −Vcc to the ferroelectric capacitor 122. Thus, the ferroelectric memory makes a transition to a point B in FIG. 42. Thereafter the ferroelectric memory sets both ends of the ferroelectric capacitor 122 to the same potential, thereby making a transition to a point "1" in FIG. 42.

In a read operation, the ferroelectric memory precharges the corresponding bit line BL to 0 V and thereafter brings the same into a floating state. Then, the ferroelectric memory activates the corresponding word line WL to Vcc. Assuming that CFE and CBL represent the capacitance of the ferroelectric capacitor 122 and the parasitic capacitance of the bit line BL respectively, this potential difference Vcc is capacitively divided by CFE and CBL. The capacitance CFE of the ferroelectric capacitor 122 can be approximated as C0 or C1 depending on the held data. Therefore, the potential of the bit line BL is expressed in the following formula (1) or (2):

$$V0 = \{C0/(C0+CBL)\} \times Vcc \quad (1)$$

$$V1 = \{C1/(C1+CBL)\} \times Vcc \quad (2)$$

The above formula (1) expresses the potential V0 of the bit line BL corresponding to the memory cell 121 holding the data "0", while the above formula (2) expresses the potential V1 of the bit line BL corresponding to the memory cell 121 holding the data "1".

A read amplifier determines the potential difference between the bit line potentials V0 and V1 expressed in the above formulas (1) and (2), thereby reading the data. In this data reading, the data in the memory cell 121 is destroyed. Therefore, the ferroelectric memory performs a write (restore) operation responsive to the read data after the data reading.

In the simple matrix ferroelectric memory, however, data of nonselected memory cells 121 disadvantageously disappear through disturbance. The simple matrix ferroelectric memory applies a potential difference ⅓ Vcc to all nonselected memory cells 121 in writing and reading. As shown in FIG. 43, therefore, the quantity of polarization is reduced due to the hysteretic property of the ferroelectric substance, leading to disappearance of data.

The one-transistor ferroelectric memory is now described with reference to FIGS. 40, 42 and 44. As shown in FIG. 44, each memory cell 131 of the one-transistor ferroelectric memory is formed by connecting a ferroelectric capacitor 132 to the gate of a MOS transistor 133. In this one-transistor ferroelectric memory, the ferroelectric capacitor 132 has first and second ends connected to a corresponding word line WL and the gate of the MOS transistor 133 constituting a cell transistor respectively. In this one-transistor ferroelectric memory, the threshold potential difference of the MOS transistor 133 varies with the direction of polarization of the ferroelectric capacitor 132, to vary a memory cell current. The one-transistor ferroelectric memory determines this variation of the memory cell current, thereby reading data. In the one-transistor ferroelectric memory reading data by detecting the memory cell current, the capacitance of the ferroelectric capacitor 132 may not be increased to some extent in consideration of a bit line capacitance, dissimilarly to the one-transistor one-capacitor ferroelectric memory shown in FIG. 40. Thus, the ferroelectric capacitor 132 can be so reduced in size that the one-transistor ferroelectric memory is suitable for refinement.

Operations of the one-transistor ferroelectric memory are now described. The one-transistor ferroelectric memory exhibits a hysteresis curve similar to that of the aforementioned simple matrix ferroelectric memory, and hence the operations thereof are described with reference to FIG. 42. In a standby state, all word lines WL, all bit line BL and all source lines SL are at 0 V. In order to write data "0" in any memory cell 131 in a write operation, the ferroelectric memory applies a step-up potential difference Vpp to the corresponding word line WL. At this time, the ferroelectric memory applies the potential Vcc capacitively divided with the gate capacitance of the MOS transistor 133 to the ferroelectric capacitor 132. Thus, the ferroelectric memory makes a transition to a point A shown in FIG. 42 despite the initial state. Thereafter the ferroelectric memory returns the word line WL to 0 V, and makes a transition to the data "0" shown in FIG. 42. In order to write data "1" in any memory cell 131, on the other hand, the ferroelectric memory applies 0 V and Vpp to the corresponding word line WL and the corresponding bit line BL respectively. In this case, the ferroelectric memory applies a potential difference −Vcc to the ferroelectric capacitor 132, thereby making a transition to a point B shown in FIG. 42. Thereafter the ferroelectric memory returns the bit line BL to 0 V, to make a transition to the data "1" shown in FIG. 42.

The one-transistor ferroelectric memory performs a read operation by activating the corresponding word line WL to a potential difference Vr causing no polarization inversion. Thus, the gate potential difference of the cell transistor (MOS transistor) 133 varies with the write state. A current flowing through the cell transistor 133 varies with the variation of the gate potential difference of the cell transistor 133, and hence the ferroelectric memory reads the current difference through the bit line BL. In other words, the one-transistor ferroelectric memory may read not the potential difference resulting from capacitive coupling between the capacitances of the ferroelectric capacitor 132 and the bit line BL but the current of the cell transistor 133, to require no polarization inversion in reading. Therefore, the one-transistor ferroelectric memory is capable of nondestructive reading. However, the one-transistor ferroelectric memory also exhibits the problem of disturbance of nonselected memory cells 131, similarly to the aforementioned simple matrix ferroelectric memory.

It is difficult to refine the conventional DRAM and the conventional flash memory as described above, and hence a memory cell system capable of higher integration is required. On the other hand, the highly integrable one-transistor and simple matrix ferroelectric memories have the aforementioned problem of disturbance resulting in disappearance of data from nonselected memory cells. Therefore, it is disadvantageously difficult to put the conventional one-transistor and simple matrix ferroelectric memories into practice.

SUMMARY OF THE INVENTION

The present invention has been proposed in order to solve the aforementioned problems, and an object of the present invention is to provide a memory capable of suppressing disturbance causing disappearance of data from a nonselected memory cell.

In order to attain the aforementioned object, a memory according to an aspect of the present invention comprises a memory cell array including bit lines, word lines arranged to intersect with the bit lines and memory cells connected between the bit lines and the word lines for holding first data or second data. The memory applies a second voltage of polarity reverse to that of a first voltage applied to a nonselected memory cell in a read operation to at least the nonselected memory cell in addition to the read operation collectively performed on all memory cells connected to a selected word line.

As hereinabove described, the memory according to this aspect applies the second voltage of polarity reverse to that of the first voltage applied to the nonselected memory cell in the read operation to at least the nonselected memory cell in addition to the read operation collectively performed on all memory cells connected to the selected word line, whereby the polarization state of the nonselected memory cell can be improved by applying the second voltage also when the polarization state is deteriorated due to application of the first voltage in the read operation. Consequently, the memory can suppress disturbance causing disappearance of the first or second data held in the nonselected memory cell.

The memory according to the aforementioned aspect preferably applies the first voltage and the second voltage of polarity reverse to that of the first voltage to at least the nonselected memory cell by the same frequencies throughout the read operation and a rewrite operation of rewriting read data. According to this structure, the polarization state of the nonselected memory cell is deteriorated and improved by the same frequencies throughout the read operation and the rewrite operation, whereby the memory can inhibit the polarization state of the nonselected memory cell from deterioration. Also when repeating the read operation and the rewrite operation, therefore, the memory can reliably prevent the nonselected memory cell from disturbance since no deterioration of the polarization state of the nonselected memory cell is accumulated. Also when the polarization states of the memory cells are dispersed, further, the memory can inhibit a partial nonselected memory cell having a small quantity of polarization from deterioration since no deterioration of the polarization state of the nonselected memory cell is accumulated. Thus, the memory causes no inconvenience of disappearance of only data of the nonselected memory cell having a small quantity of polarization.

In this case, the rewrite operation preferably consists of a plurality of operations.

In the aforementioned structure of the rewrite operation consisting of a plurality of operations, the rewrite operation preferably includes a pair of first and second periods, and the memory cell preferably applies a voltage of polarity reverse to that of a voltage applied to the nonselected memory in the first period of the rewrite operation to the nonselected memory cell in the second period of the rewrite operation. According to this structure, the memory can improve the polarization state of the nonselected memory cell in the second period of the rewrite operation also when the polarization state of the nonselected memory cell is deteriorated in the first period of the rewrite operation.

The memory according to the aforementioned aspect preferably applies the second voltage of polarity reverse to that of the first voltage applied to the nonselected memory cell in the read operation to the nonselected memory cell by driving any of the nonselected word line, all bit lines connected to the selected memory cell and all selected and nonselected word lines. According to this structure, the memory can easily apply the second voltage of polarity reverse to that of the first voltage applied to the nonselected memory cell in the read operation to the nonselected memory cell.

In this case, the memory may apply the second voltage of polarity reverse to that of the first voltage applied to the nonselected memory cell in the read operation to the nonselected memory cell by driving the nonselected word line.

In the aforementioned structure of applying the second voltage of polarity reverse to that of the first voltage applied to the nonselected memory cell in the read operation to the nonselected memory cell by driving any of the nonselected word line, all bit lines connected to the selected memory cell and all selected and nonselected word lines, the memory may apply the second voltage of polarity reverse to that of the first voltage applied to the nonselected memory cell in the read operation to the nonselected memory cell by driving all bit lines connected to the selected memory cell.

In the memory according to the aforementioned aspect, the second voltage is preferably set to a value capable of substantially recovering a reduced quantity of polarization when the quantity of polarization is reduced due to application of the first voltage to the nonselected memory cell. According to this structure, the memory can easily improve the polarization state of the nonselected memory cell by applying the second voltage also when the polarization state of the nonselected memory cell is deteriorated due to application of the first voltage.

In this case, the second voltage is preferably smaller than a voltage generated in the bit line from which the first data has been read in the read operation and larger than a voltage generated in the bit line from which the second data has been read in the read operation. According to this structure, the balance between reduction and recovery (increase) of the quantity of polarization of the nonselected memory cell can be improved.

In the memory according to the aforementioned aspect, the second voltage preferably includes a third voltage applied to a nonselected memory cell connected to the bit line from which the first data has been read in the read operation and a fourth voltage applied to the nonselected memory cell connected to the bit line from which the second data has been read in the read operation. According to this structure, the third voltage can be set to a value substantially identical to the voltage applied to the nonselected memory cell connected to the bit line from which the first data has been read in the read operation, while the fourth voltage can be set to a value substantially identical to that of the voltage applied to the nonselected memory cell connected to the bit line from which the second data has been read in the read operation. Thus, the reduced quantity of polarization of the nonselected memory cell connected to the bit line from which the first data has been read in the read operation can be substantially equalized with the quantity of polarization recovered by application of the third voltage, while the reduced quantity of polarization of the nonselected memory cell connected to the bit line from which the second data has been read in the read operation can be substantially equalized with the quantity of polarization recovered by application of the fourth voltage. Consequently, the balance between reduction and recovery of the quantities of polarization of the nonselected memory cells connected to the bit lines from which the first and second data have been read in the read operation respectively can be further improved.

In this case, the memory preferably applies the third voltage to the nonselected memory cell connected to the bit line from which the first data has been read in the read operation by driving the bit line from which the first data has been read in the read operation while applying the fourth voltage to the nonselected memory cell connected to the bit line from which the second data has been read in the read operation by driving the bit line from which the second data has been read in the read operation. According to this structure, the memory can easily apply the third voltage to the nonselected memory cell connected to the bit line from which the first data has been read in the read operation and apply the fourth voltage to the nonselected memory cell connected to the bit line from which the second data has been read in the read operation.

In the aforementioned structure of the second voltage including the third and fourth voltages, the third voltage is preferably substantially identical to a voltage applied in the read operation to the nonselected memory cell connected to the bit line from which the first data has been read in the read operation, and the fourth voltage is preferably substantially identical to a voltage applied in the read operation to the nonselected memory cell connected to the bit line from which the second data has been read in the read operation. According to this structure, the balance between reduction and recovery of the quantities of polarization of the nonselected memory cells connected to the bit lines from which the first and second data have been read in the read operation respectively can be easily recovered.

In this case, a quantity of polarization recovered by application of the third voltage to the nonselected memory cell connected to the bit line from which the first data has been read is preferably substantially identical to a quantity of polarization reduced by application of the first voltage to the nonselected memory cell connected to the bit line from which the first data has been read, and a quantity of polarization recovered by application of the fourth voltage to the nonselected memory cell connected to the bit line from which the second data has been read is preferably substantially identical to a quantity of polarization reduced by application of the first voltage to the nonselected memory cell connected to the bit line from which the second data has been read. According to this structure, the balance between reduction and recovery of the quantities of polarization of the nonselected memory cells connected to the bit lines from which the first and second data have been read in the read operation respectively can be more easily improved.

The memory according to the aforementioned aspect may apply the second voltage to the nonselected memory cell in advance of the read operation. According to this structure, the memory can easily apply voltages reversed in polarity to each other to the nonselected memory cell by the same frequencies throughout the read operation and the rewrite operation of rewriting the read data.

In this case, the memory preferably brings all bit lines into floating states and applying a voltage for reading the first data and the second data to the selected word line immediately after applying the second voltage to the nonselected memory cell in the read operation. According to this structure, the second voltage is added to the voltage for reading the first and second data, whereby the memory can apply a voltage exceeding the voltage for reading the first and second data to the selected memory cell. Thus, the potential difference between the read potentials for the first and second data can be so increased that reading accuracy of the memory can be improved.

In the aforementioned structure of applying the second voltage to the nonselected memory cell in advance of the read operation, the memory preferably brings all bit lines into floating states from an initial state, applies the second voltage to the nonselected memory cell by applying a fifth voltage for reading to the selected word line, thereafter brings all bit lines into floating states and applies a sixth voltage for reading to the selected word line in the read operation, for reading data on the basis of a voltage generated in the bit lines after application of the sixth voltage and a voltage of the bit lines in the initial state. According to this structure, the memory can self-determine data on the basis of the voltage generated in the bit lines after application of the sixth voltage and the voltage of the bit lines in the initial state, to require no reference voltage. Further, the memory applies the second voltage to the nonselected memory cell by applying the fifth voltage for reading to the selected word line, whereby the polarization state of the nonselected memory cell can be improved by application of the fifth voltage also when the polarization state is deteriorated due to application of the first voltage to the nonselected memory cell in the read operation. Consequently, the memory may not separately generate a reference voltage but can suppress disturbance. Also when cell characteristics are dispersed, further, the memory capable of self-determining data can suppress influence by such dispersion of the cell characteristics as compared with a case of determining data through comparison with a reference voltage.

In this case, the memory preferably further comprises a chopper comparator, connected to the bit lines, having a prescribed logical threshold voltage and reading the data, and the chopper comparator preferably determines the data on the basis of the logical threshold voltage and a read voltage generated in the bit lines. According to this structure, the memory can easily self-determine data by comparing the logical threshold voltage with the read voltage generated in the bit lines.

The memory according to the aforementioned aspect may apply the second voltage to the nonselected memory cell after the read operation. According to this structure, the memory can easily apply voltages reversed in polarity to each other to the nonselected memory cell by the same frequencies throughout the read operation and the rewrite operation of rewriting the read data.

In the memory according to the aforementioned aspect, a period for applying the second voltage to the nonselected memory cell is preferably substantially identical to a period for applying the first voltage to the nonselected memory cell.

In the memory according to the aforementioned aspect, the memory cells preferably include ferroelectric capacitors. According to this structure, the memory including the ferroelectric capacitors can easily suppress disturbance causing disappearance of first or second data held in the nonselected memory cell.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7 to 10 are hysteresis diagrams showing polarization states of memory cells of the ferroelectric memory according to the first embodiment of the present invention;

DESCRIPTION OF THE PREFERRED EMBODIMENTS

Embodiments of the present invention are now described with reference to the drawings.

First Embodiment

A simple matrix ferroelectric memory according to a first embodiment of the present invention is described with reference to read-rewrite operations collectively performed on all memory cells connected to an arbitrary word line.

The overall structure of the simple matrix ferroelectric memory according to the first embodiment is described with reference to FIG. 1.

Figure 1:
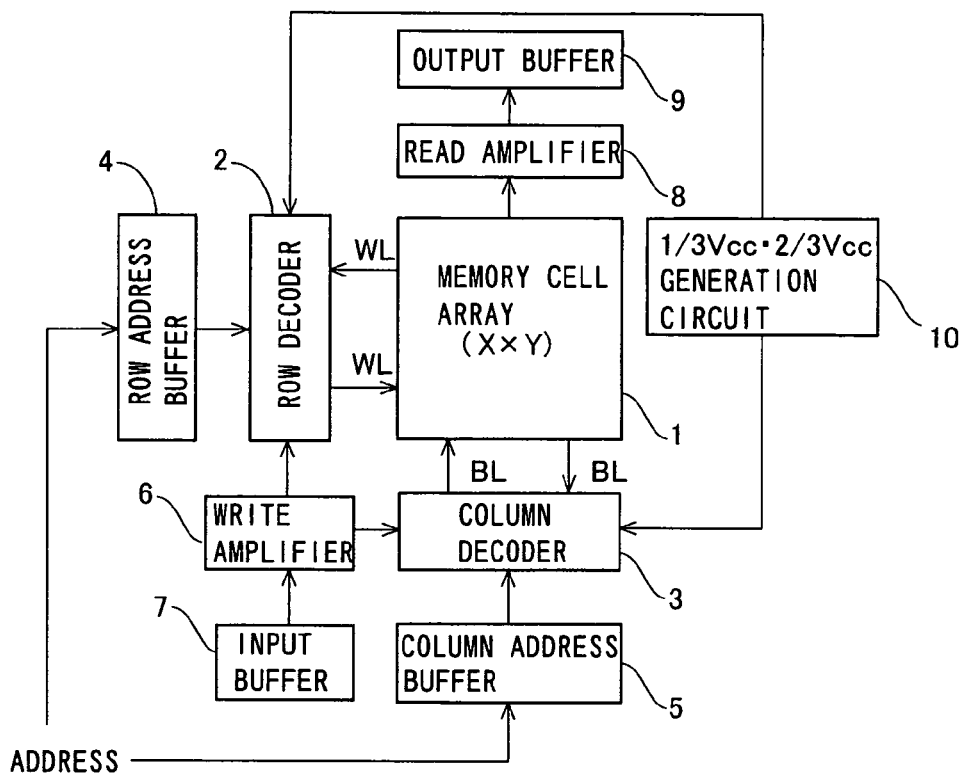
FIG. 1 is a block diagram showing the overall structure of a simple matrix ferroelectric memory according to a first embodiment of the present invention.

As shown in FIG. 1, the ferroelectric memory according to the first embodiment comprises a memory cell array 1, a row decoder 2, a column decoder 3, a row address buffer 4, a column address buffer 5, a write amplifier 6, an input buffer 7, a read amplifier 8 formed by a voltage sense amplifier, an output buffer 9 and a ⅓ Vcc•⅔ Vcc generation circuit 10.

Figure 41:
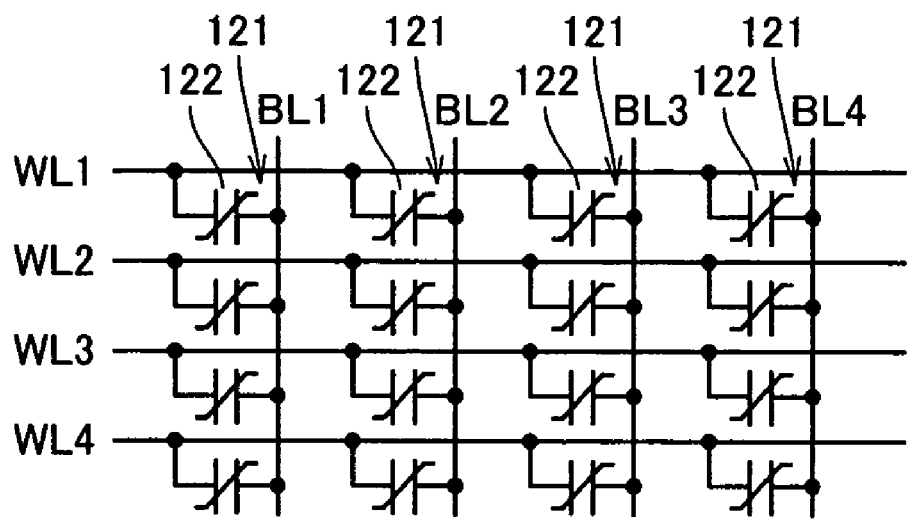
FIG. 41 is an equivalent circuit diagram showing a memory cell array of a simple matrix ferroelectric memory.
Figure 42:
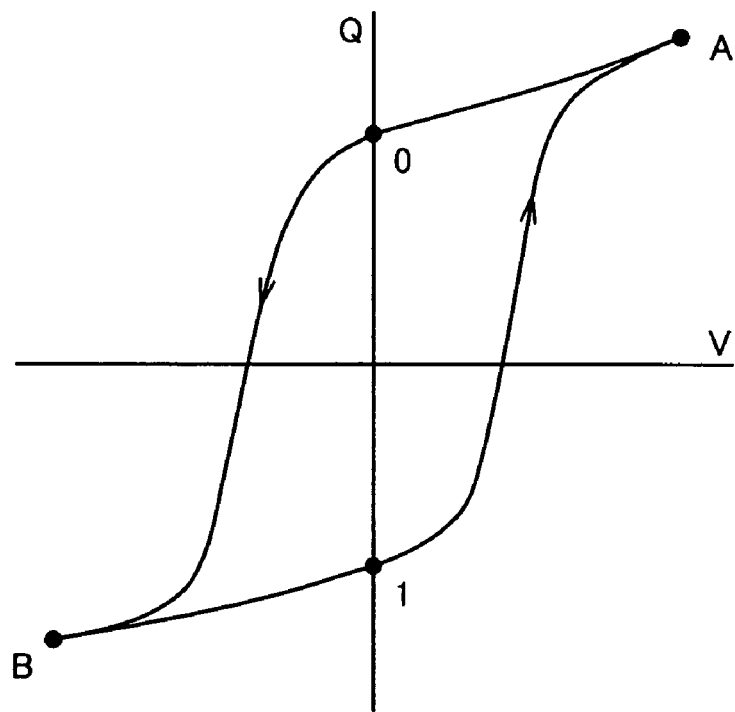
FIG. 42 is a hysteresis diagram for illustrating operations of the simple matrix ferroelectric memory.
Figure 43:
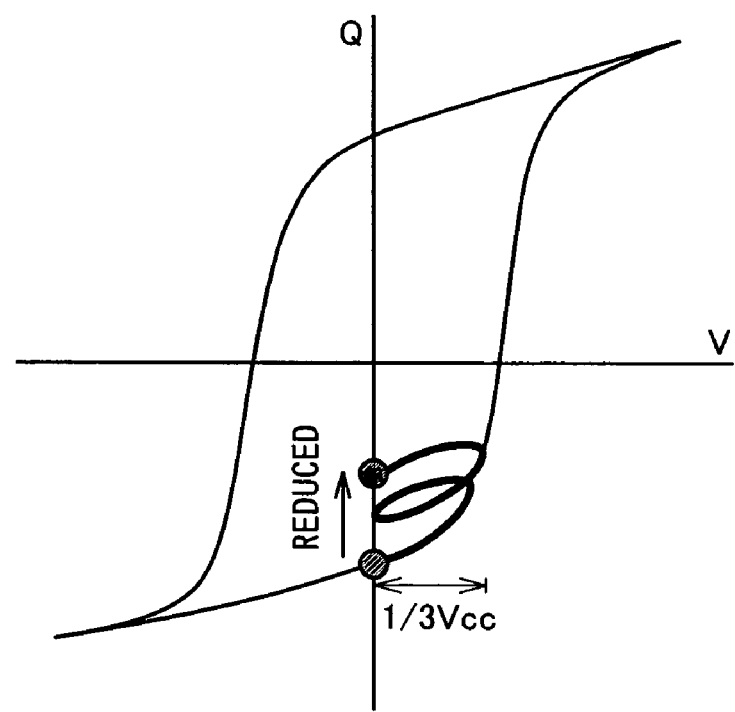
FIG. 43 is a hysteresis diagram for illustrating disturbance in the simple matrix ferroelectric memory.
Figure 44:
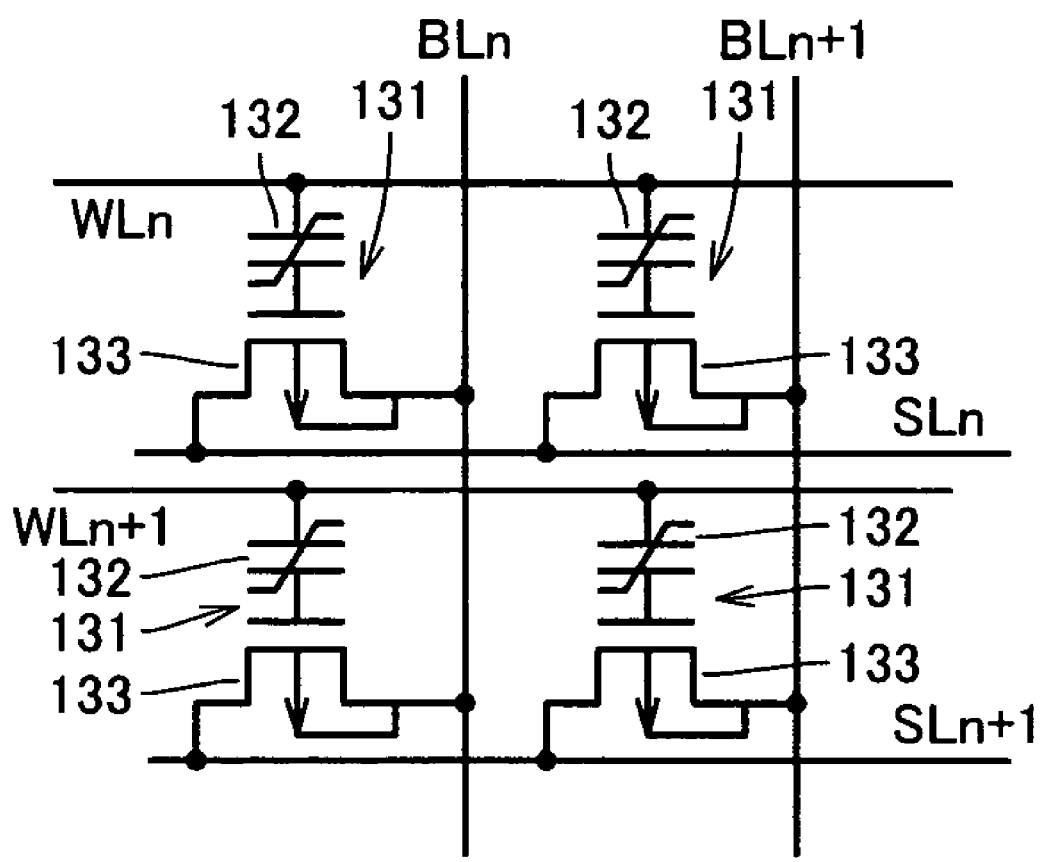
FIG. 44 is an equivalent circuit diagram showing memory cells of a one-transistor ferroelectric memory.

The memory cell array 1 includes a plurality of simple matrix memory cells formed by only ferroelectric capacitors (not shown). In other words, the simple matrix memory cells according to the first embodiment are constituted of ferroelectric capacitors formed by word lines WL and bit lines BL extending in directions intersecting with each other and ferroelectric films (not shown) arranged between the word lines WL and the bit lines BL, similarly to the conventional simple matrix memory cells shown in FIG. 41. As shown in FIG. 1, the row decoder 2 and the column decoder 3 are connected to the word lines WL and the bit lines BL of the memory cell array 1 respectively. The ⅓ Vcc•⅔ Vcc generation circuit 10 is connected to the row decoder 2 and the column decoder 3. Thus, the ferroelectric memory can apply ⅓ Vcc and ⅔ Vcc to the word lines WL and the bit lines BL. The row decoder 2 and the column decoder 3 are constituted to be capable of applying Vcc (a power supply voltage or a voltage generated on the basis of the power supply voltage) and 0 V to the word lines WL and the bit lines BL.

Figure 2:
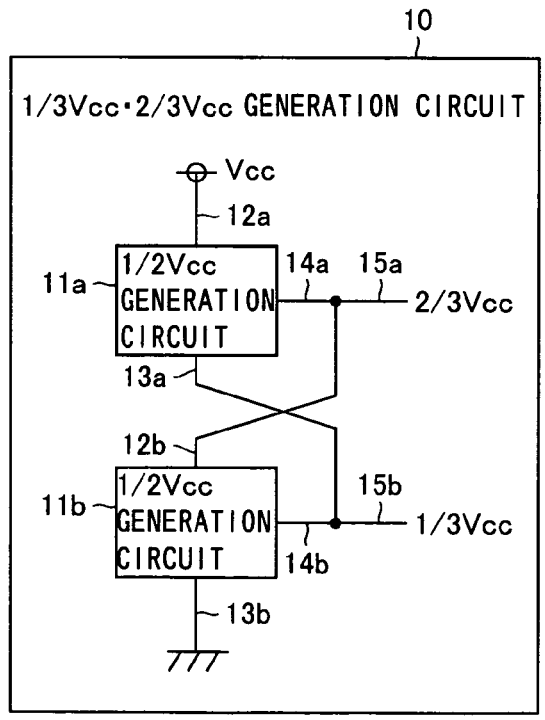
FIG. 2 is a circuit diagram showing the internal structure of a ⅓ Vcc•⅔ Vcc generation circuit of the ferroelectric memory according to the first embodiment shown in FIG. 1.

As shown in FIG. 2, the ⅓ Vcc•⅔ Vcc generation circuit 10 is formed by a combination of two ½ Vcc generation circuits 11a and 11b. Each ½ Vcc generation circuit 11a (11b) has two voltage input terminals 12a (12b) and 13a (13b) and a voltage output terminal 14a (14b). The voltage input terminal 12a of the first ½ Vcc generation circuit 11a receives Vcc, while the voltage input terminal 13a is connected to the voltage output terminal 14b of the second ½

Vcc generation circuit 11b. The voltage output terminal 14a of the first ½ Vcc generation circuit 11a is connected to the voltage input terminal 12b of the second ½ Vcc generation circuit 11b. 0 V is applied to the voltage input terminal 13b of the second ½ Vcc generation circuit 11b.

According to this structure, an intermediate voltage ⅔ Vcc between Vcc and ⅓ Vcc is obtained from a first voltage output terminal 15a of the ⅓ Vcc•⅔ Vcc generation circuit 10 (the voltage output terminal 14a of the first ½ Vcc generation circuit 11a). Another intermediate voltage ⅓ Vcc between ⅔ Vcc and 0 V is obtained from a second voltage output terminal 15b of the ⅓ Vcc•⅔ Vcc generation circuit 10 (the voltage output terminal 14b of the second ½ Vcc generation circuit 11b).

Figure 3:
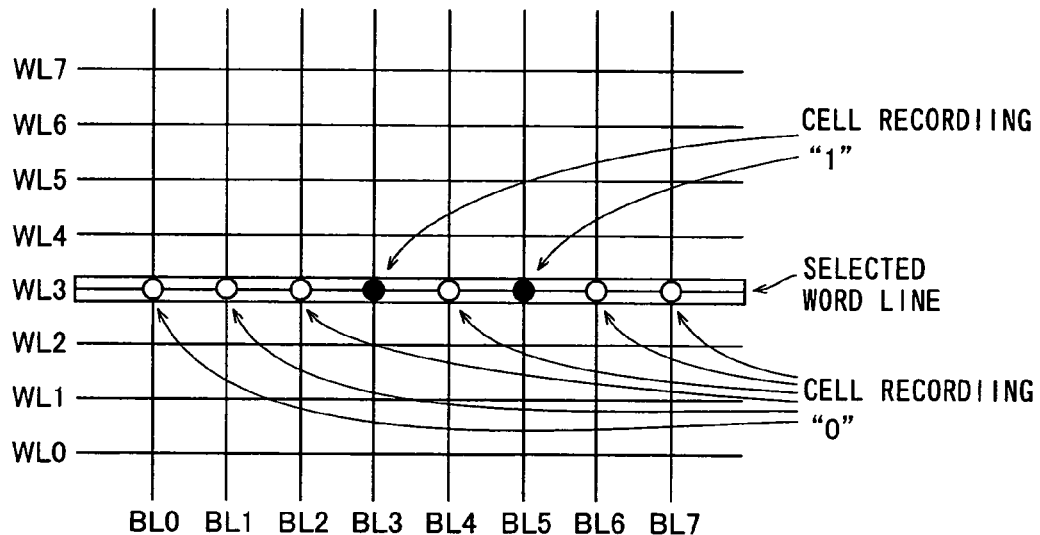
FIG. 3 is a schematic diagram for illustrating data held by selected memory cells of the ferroelectric memory according to the first embodiment of the present invention.
Figure 4:
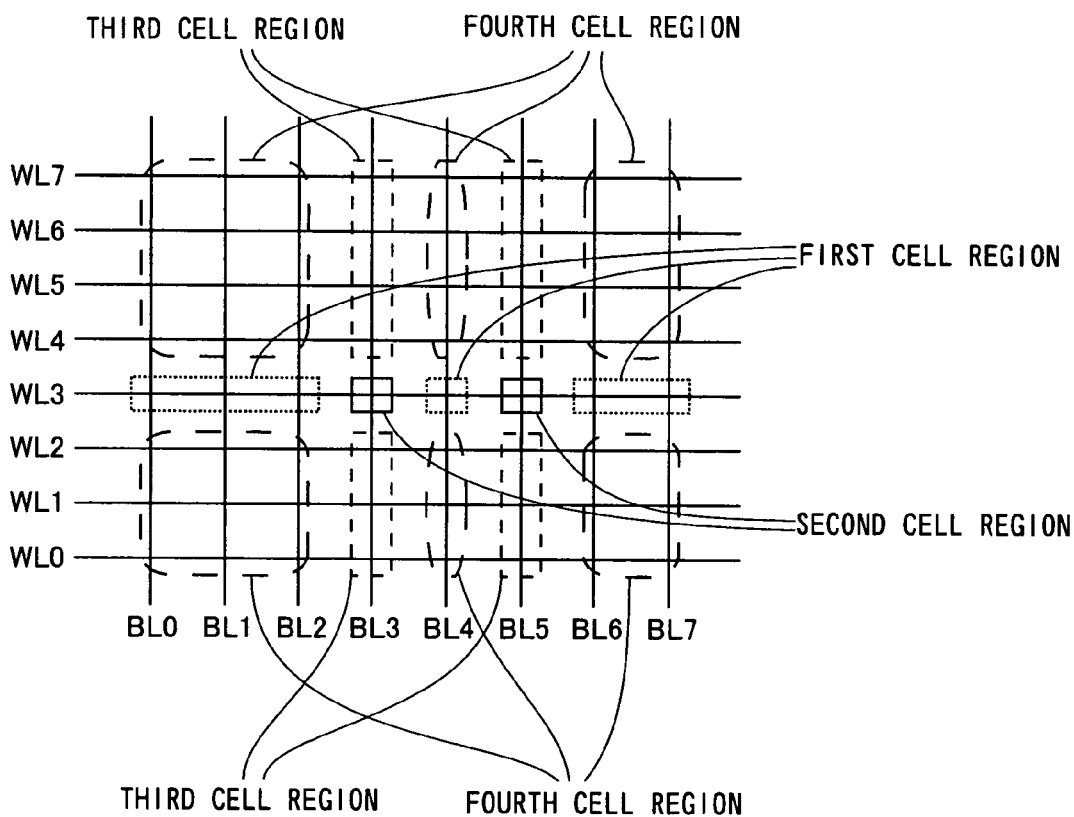
FIG. 4 is a schematic diagram for illustrating definition of cell regions of the ferroelectric memory according to the first embodiment of the present invention.

The read-rewrite operations of the ferroelectric memory according to the first embodiment are described with reference to FIGS. 3 to 23. According to the first embodiment, the ferroelectric memory selects a word line (hereinafter referred to as a selected word line) WL3 while keeping word lines (hereinafter referred to as nonselected word lines) WL0 to WL2 and WL4 to WL7 nonselected, as shown in FIG. 3. It is assumed that memory cells connected to bit lines BL3 and BL5 store data "1" while memory cells connected to the remaining bit lines BL0 to BL2, BL4, BL6 and BL7 store data "0" respectively among those connected to the selected word line WL3. It is also assumed that the memory cells, connected to the selected word line WL3, storing the data "0" and "1" respectively form first cell regions and second cell regions respectively, as shown in FIG. 4. It is further assumed that the memory cells, connected to the nonselected word lines WL0 to WL2 and WL4 to WL7, connected to the bit lines BL3 and BL5 and the bit lines BL0 to BL2, BL4, BL6 and BL7 respectively form third cell regions and fourth cell regions respectively. In other words, the first and second cell regions include selected memory cells, while the third and fourth cell regions include nonselected memory cells. The data "1" and "0" are examples of the "first data" and the "second data" in the present invention respectively. In the following description of the read-rewrite operations, the term "deterioration of the polarization states of memory cells" indicates reduction of the quantities of polarization of the memory cells, and the term "improvement of the polarization states of memory cells" indicates recovery (increase) of the quantities of polarization of the memory cells.

Figure 5:
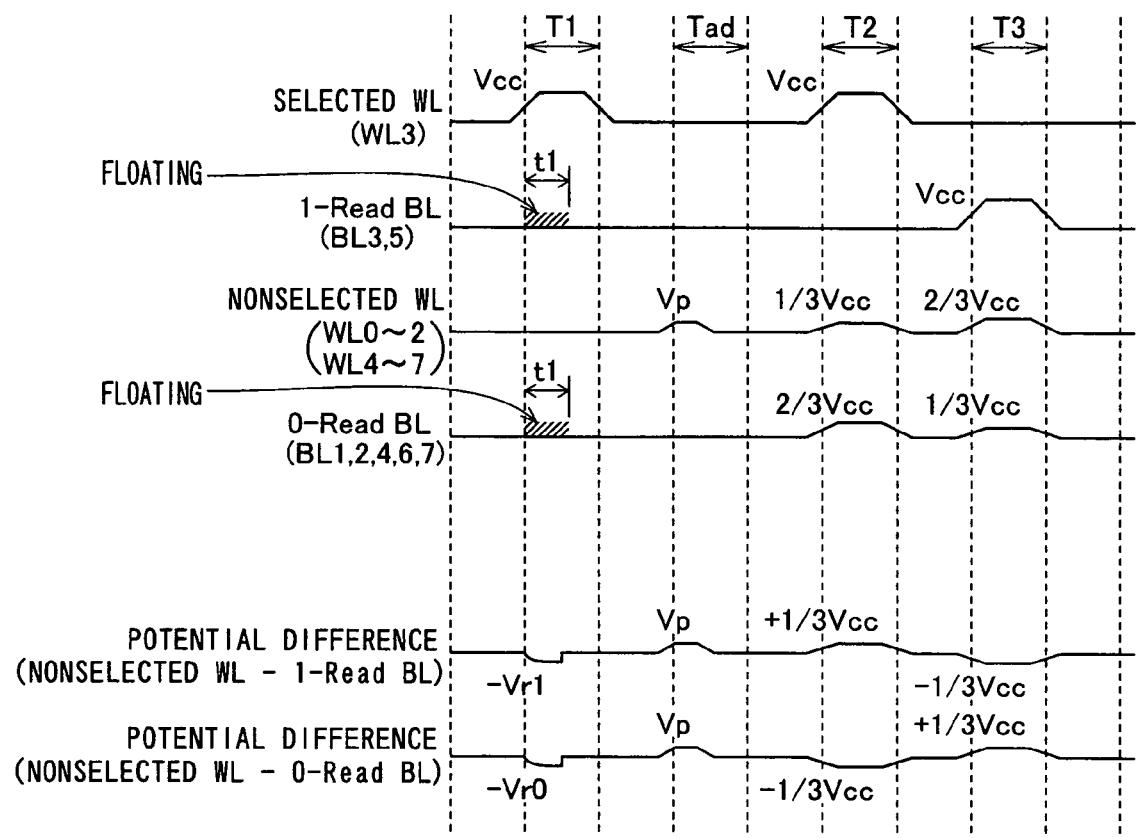
FIG. 5 is a voltage waveform diagram for illustrating read-rewrite operations of the ferroelectric memory according to the first embodiment of the present invention.

As shown in FIG. 5, the ferroelectric memory according to the first embodiment performs the read-rewrite operations in periods T1, Tad, T2 and T3. The memory decides the periods T2 and T3 so that the quantities of polarization equally vary in the memory cells when applying voltages reversed in polarity to each other to the memory cells in the periods T2 and T3 respectively. In general, the periods T2 and T3 are identically for T seconds. The memory may perform the operations in the periods T1, Tad, T2 and T3 continuously or independently of each other.

The operations in the periods T1, Tad, T2 and T3 are now described. In advance of the period T1, the ferroelectric memory is in a standby state, and all bit lines BL0 to BL7 and all word lines WL0 to WL7 are at 0 V. When activated by an external signal or an internally generated signal, the ferroelectric memory makes a transition to the period T1.

(Period T1: Read Operation)

In the period T1, the ferroelectric memory brings the potentials of all bit lines BL0 to BL7 from 0 V (standby state) into floating states for a period t1, while setting the potential of the selected word line WL3 to Vcc at the same timing or in a delay by several nsec. to several 10 nsec. The ferroelectric memory also holds the nonselected word lines WL0 to WL2 and WL4 to WL7 at 0 V. At this time, the potentials of the bit lines BL0 to BL2, BL4, BL6 and BL7 reach a read potential Vr0, while the potentials of the bit lines BL3 and BL5 reach a read potential Vr1. In this state, the ferroelectric memory determines data "0" or "1" by detecting the voltages of all bit lines BL0 to BL7. The ferroelectric memory determines the data "0" or "1" by comparing the voltages of the bit lines BL0 to BL7 with a separately generated reference voltage through the read amplifier 8 (see FIG. 1) formed by a voltage sense amplifier.

Figure 6:
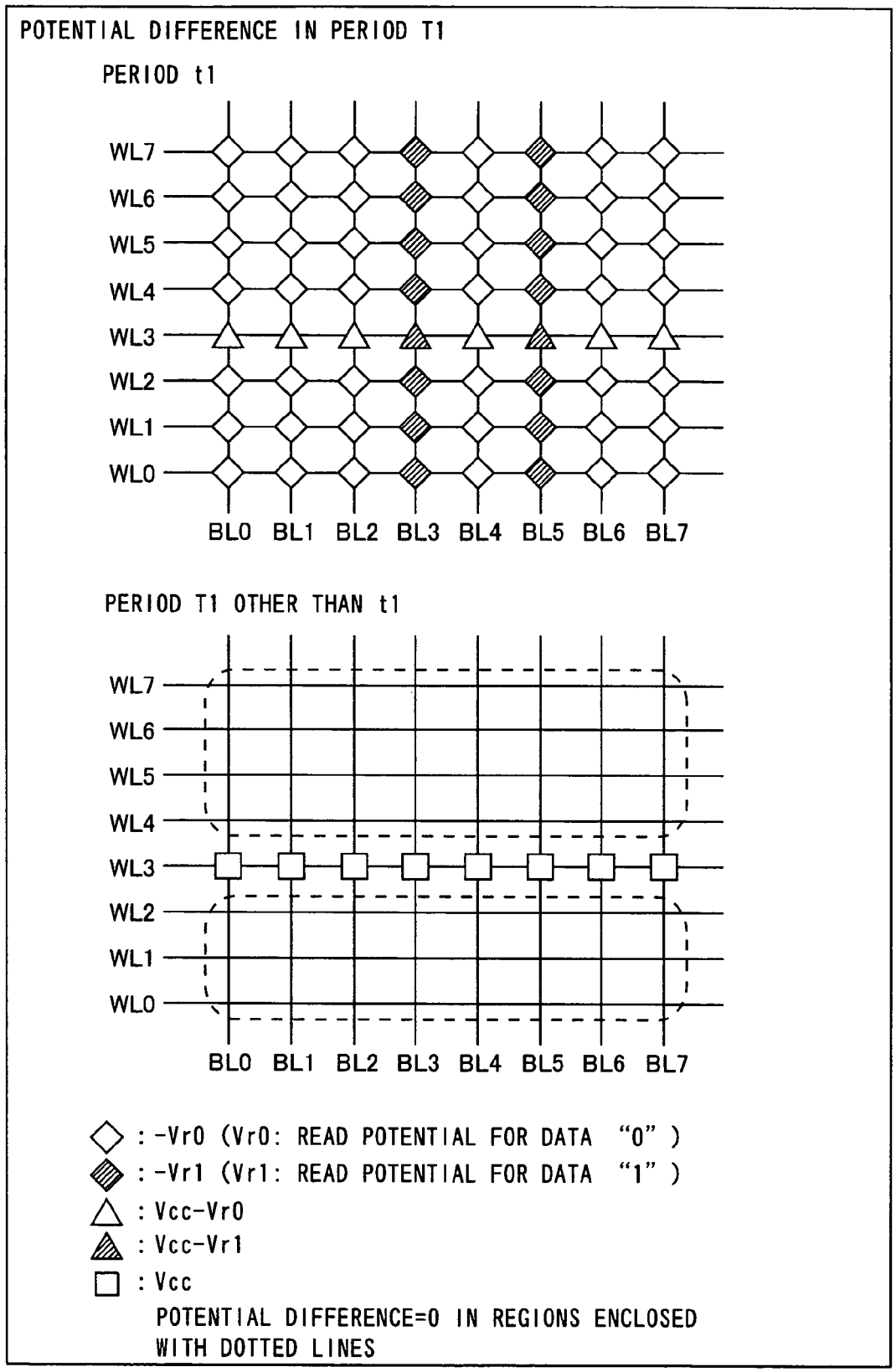
FIG. 6 is a distribution diagram showing potential differences caused in a memory cell array of the ferroelectric memory according to the first embodiment of the present invention.

The upper half of FIG. 6 shows potential differences caused in the memory cells of the first to fourth cell regions (see FIG. 4) in the period t1. In other words, the ferroelectric memory applies a voltage (Vcc−Vr0) to the memory cells (selected memory cells) of the first cell regions. The ferroelectric memory also applies a voltage (Vcc−Vr1) to the memory cells (selected memory cells) of the second sell regions. The ferroelectric memory further applies a voltage −Vr1 to the memory cells (nonselected memory cells) of the third cell regions. The ferroelectric memory further applies a voltage −Vr0 to the memory cells (nonselected memory cells) of the fourth cell regions. The voltages −Vr1 and −Vr0 applied to the nonselected memory cells are examples of the "first voltage" in the present invention. After a lapse of the period t1, the ferroelectric memory sets the potentials of all bit lines BL0 to BL7 to 0 V. This period corresponds to the period T1 other than the period t1, and the memory cells of the first to fourth regions cause potential differences shown in the lower half of FIG. 6. In other words, the ferroelectric memory applies the voltage Vcc to the memory cells of the first and second cell regions, while the memory cells of the third and fourth cell regions cause no potential differences. After a lapse of the period T1, the ferroelectric memory sets the potential of the selected word line WL to 0 V (standby state), thereby completing the read operation.

Figure 7:
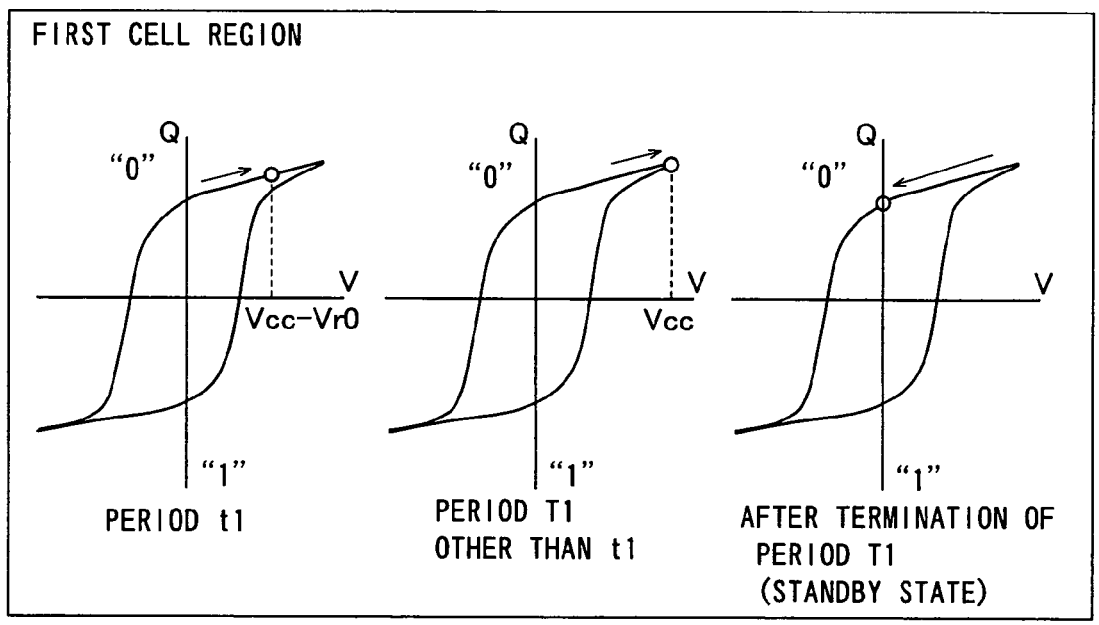
Figure 8:
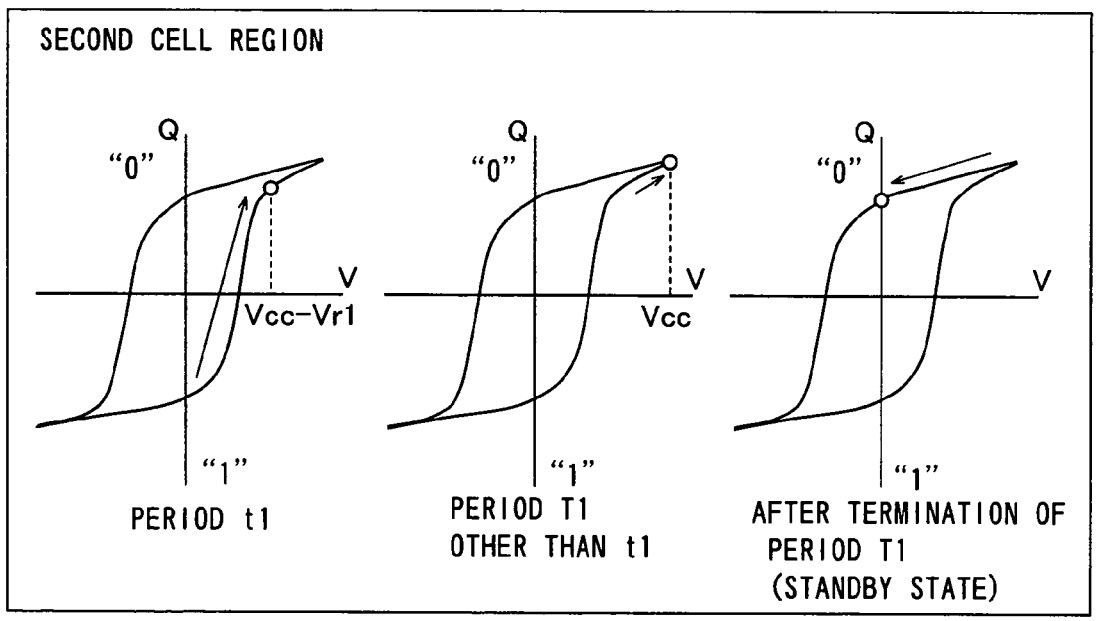

FIGS. 7 and 8 show polarization changes of the memory cells (selected memory cells) of the first and second cell regions in the period T1 respectively. As shown in FIG. 7, the data "0" having been stored in the memory cells of the first cell regions causing no polarization inversion are not destroyed. As shown in FIG. 8, on the other hand, data "1" having been stored in the memory cells of the second cell regions are destroyed due to polarization inversion, so that data "0" are written in the memory cells.

Figure 9:
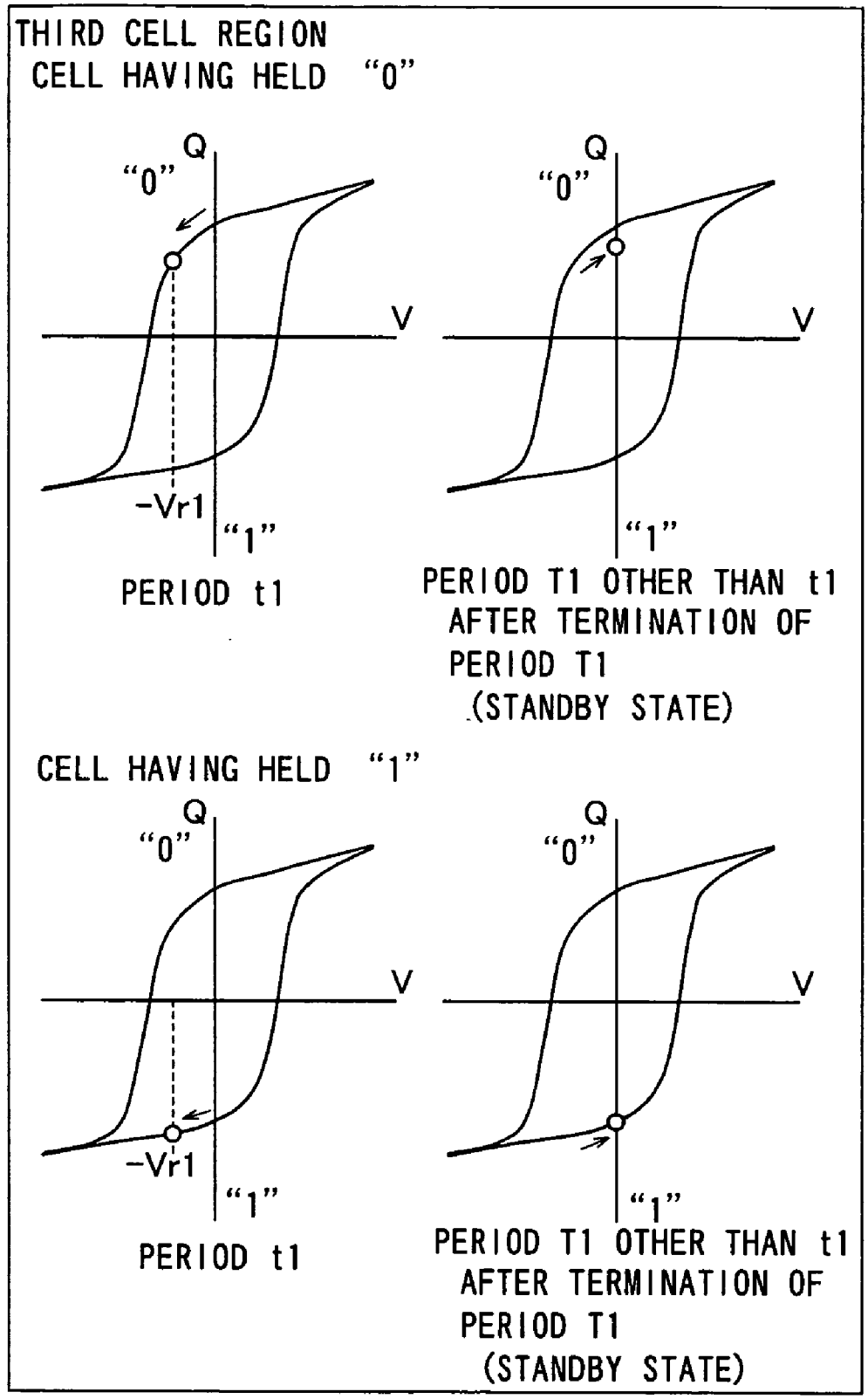

As to polarization changes of the memory cells (nonselected memory cells) of the third and fourth regions in the period T1, the polarization states are improved or deteriorated depending on the contents of the stored data, as shown in FIGS. 9 and 10 respectively. As shown in FIG. 9, the polarization states of the memory cells of the third cell regions are deteriorated when the memory cells have held the data "0", while the former are improved when the latter have held the data "1". As shown in FIG. 10, the polarization states of the memory cells of the fourth cell regions are deteriorated when the memory cells have held the data "0", while the former are improved when the latter have held the data "1".

(Period Tad)

Then, the ferroelectric memory according to the first embodiment applies voltages of polarity reverse to that of the voltages applied to the memory cells (nonselected memory cells) of the third and fourth regions in the period T1 to the memory cells of the third and fourth cell regions, as shown in FIG. 5. More specifically, the ferroelectric memory sets the potentials of the nonselected word lines WL0 to WL2 and WL4 to WL7 to Vp. According to the first embodiment, Vp is set to satisfy the following relational expression:

$$Vr0<Vp<Vr1$$

The ferroelectric also holds the selected word line WL3 and all bit lines BL0 to BL7 at 0 V.

Figure 11:
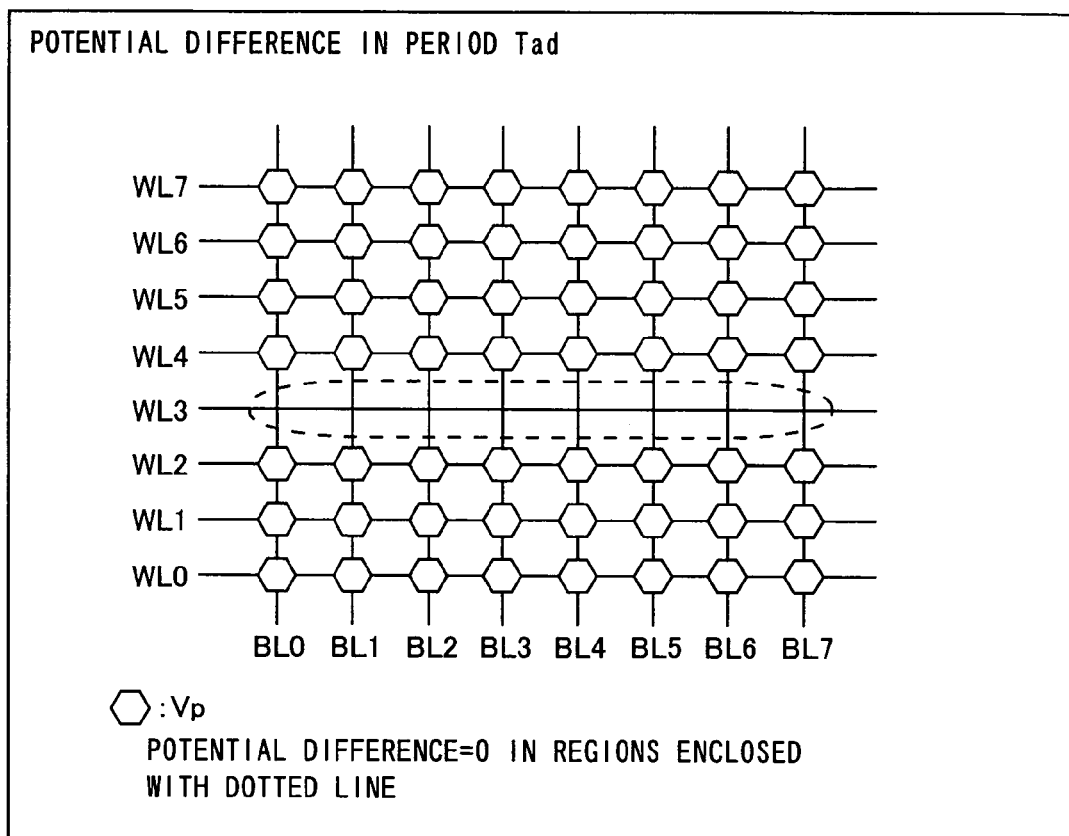
FIG. 11 is a distribution diagram showing potential differences caused in the memory cell array of the ferroelectric memory according to the first embodiment of the present invention.

FIG. 11 shows potential differences caused in the memory cells of the first to fourth cell regions in the period Tad. In other words, the memory cells (selected memory cells) of the first and second cell regions cause no potential differences. The ferroelectric memory applies Vp of polarity reverse to that of −Vr1 and −Vr0 to the memory cells (nonselected memory cells) of the third and fourth regions. The period for applying the voltage Vp to the memory cells of the third and fourth cell regions is preferably set identical to the period t1 for applying the voltages −Vr1 and −Vr0 to the memory cells of the third and fourth cell regions in the period T1. The voltage Vp is an example of the "second voltage" in the present invention. After a lapse of the period Tad, the ferroelectric memory sets the potentials of the nonselected word lines WL0 to WL2 and WL4 to WL7 to 0 V (standby state).

Figure 12:
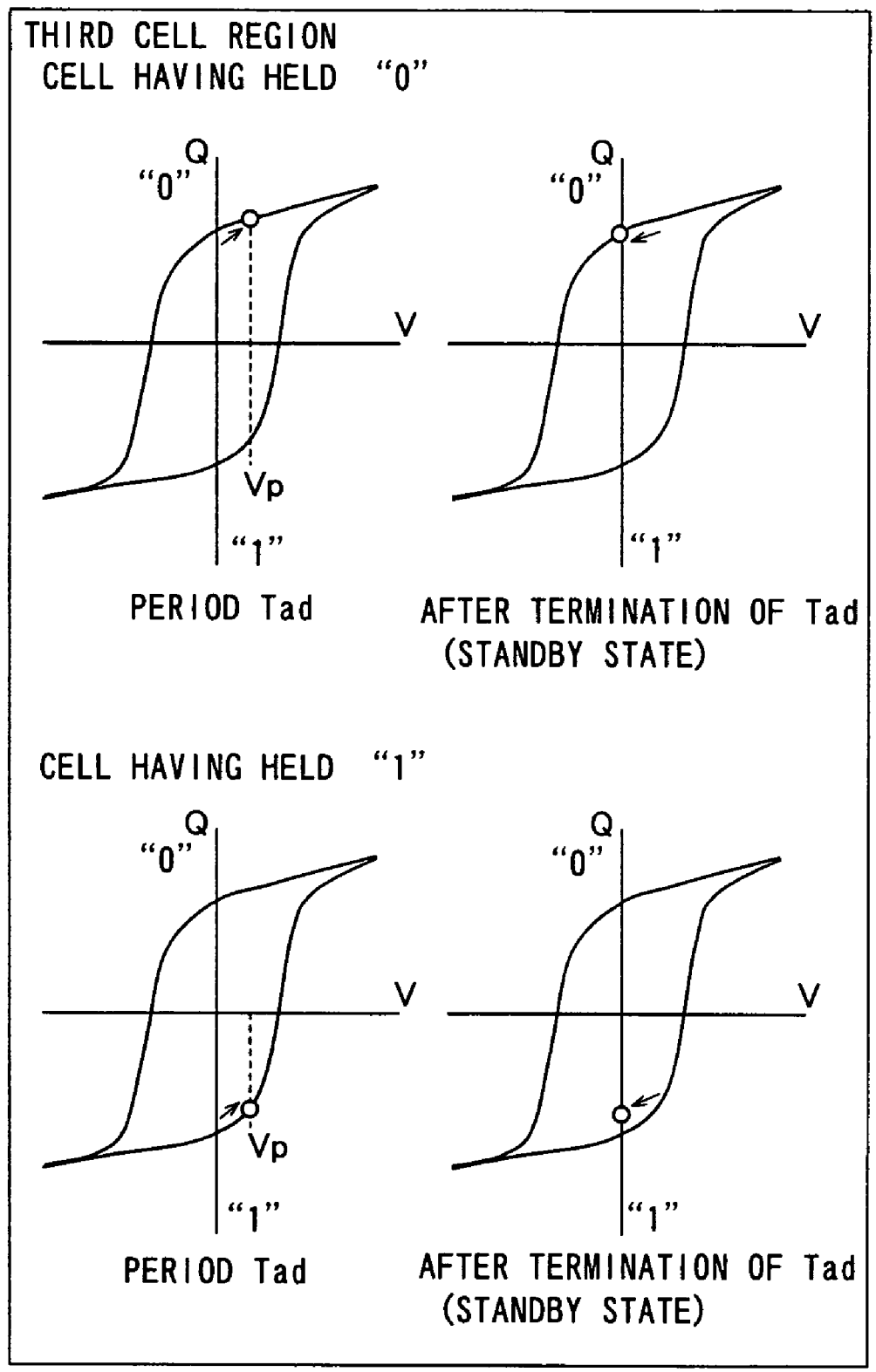
FIGS. 12 and 13 are hysteresis diagrams showing polarization states of the memory cells of the ferroelectric memory according to the first embodiment of the present invention.
Figure 13:
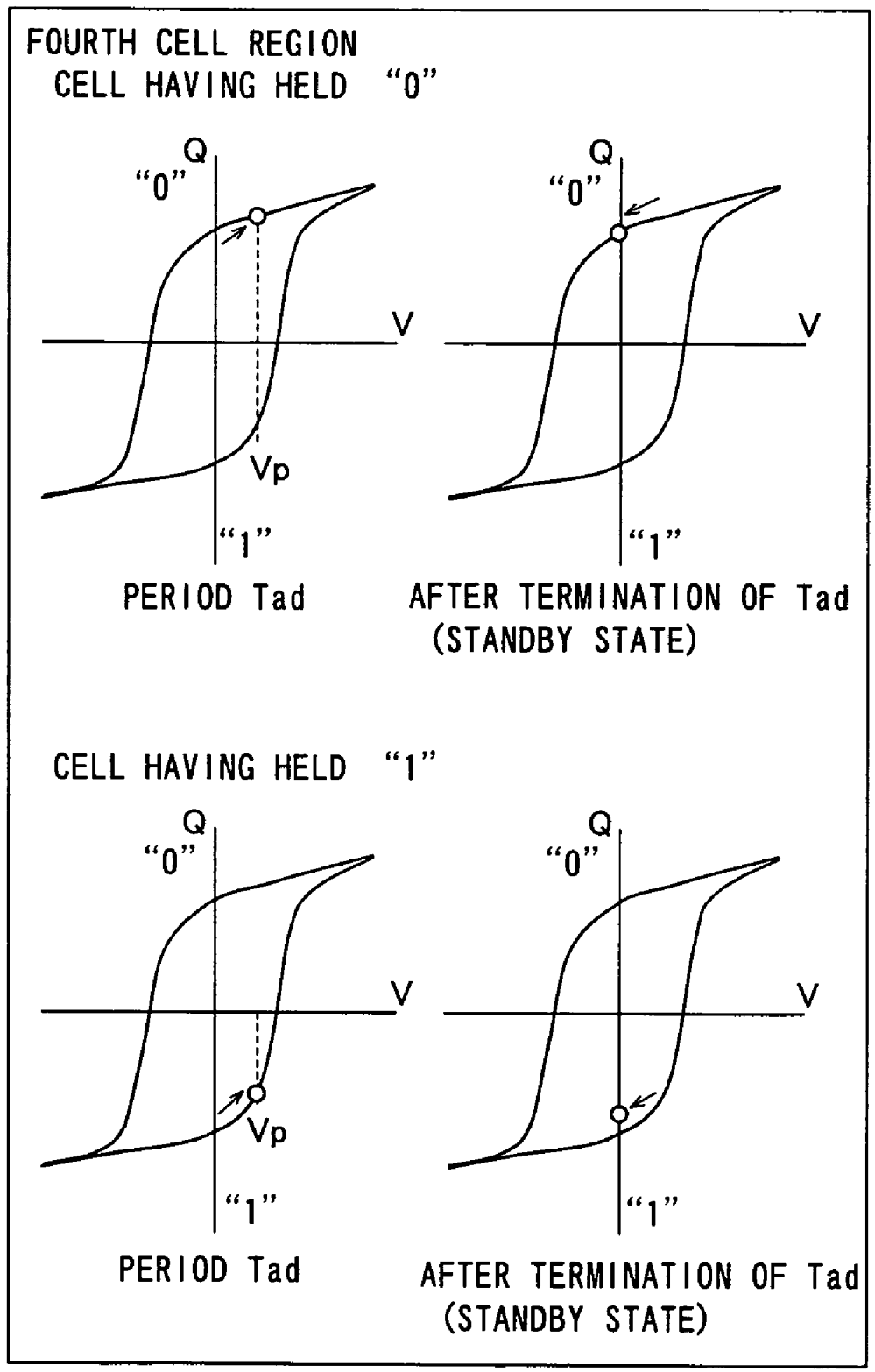

As to polarization changes of the memory cells (nonselected memory cells) of the third and fourth regions in the period Tad, the polarization states are improved or deteriorated depending on the contents of the stored data, as shown in FIGS. 12 and 13 respectively. As shown in FIG. 12, the polarization states of the memory cells of the third cell regions are deteriorated when the memory cells have held the data "0", while the former are improved when the latter have held the data "1". As shown in FIG. 13, on the other hand, the polarization states of the memory cells of the fourth cell regions are deteriorated when the memory cells have held the data "0", while the former are improved when the latter have held the data "1".

According to the first embodiment, Vp is set to satisfy the relational expression Vr0<Vp<Vr1 as hereinabove described, whereby the balance between reduction of the quantities of polarization (deterioration of polarization states) and recovery of the quantities of polarization (improvement of polarization states) of the memory cells of the third and fourth cell regions can be improved. The reason for this is now described with reference to FIGS. 10, 12 and 13. In the period T1 (see FIG. 10), the quantities of polarization are reduced in the memory cells of the fourth cell regions having held the data "0". In this case, Vp has the minimum value and it follows that recovery of the quantities of polarization in the period Tad (see FIG. 13) is most inferior (smallest) if Vp is less than Vr0 among the following three relational expressions:

$$Vp<Vr0$$

$$Vr0<Vp<Vr1$$

$$Vr1<Vp$$

In this case, reduction of the quantities of polarization in the period T1 and that in the period Tad are unbalanced. In the memory cells of the third cell regions having held the data "1", the quantities of polarization are recovered in the period T1 (see FIG. 10). In this case, Vp has the maximum value and it follows that the quantities of polarization are maximally reduced in the period Tad if the following relational expression holds in the period Tad (see FIG. 12):

$$Vr1<Vp$$

Also in this case, reduction of the quantities of polarization in the period T1 and that in the period Tad are unbalanced. According to the first embodiment setting Vp to satisfy the relational expression Vr0<Vp<Vr1, on the other hand, recovery of the quantities of polarization in the period Tad can be increased as compared with the case of Vp<Vr0, and reduction of the quantities of polarization in the period Tad can be rendered smaller as compared with the case of Vr1<Vp. Thus, the degree of unbalance between reduction and recovery of the quantities of polarization of the memory cells (nonselected memory cells) of the third and fourth cell regions is reduced according to the first embodiment, whereby the balance between reduction and recovery of the quantities of polarization can be improved.

(Periods T2 and T3: Rewrite Operation)

Then, the ferroelectric memory sets the potential of the selected word line WL3 to Vcc while setting the potentials of the nonselected word lines WL0 to WL2 and WL4 to WL7 to ⅓ Vcc in the period T2, as shown in FIG. 5. In this period T2, further, the ferroelectric memory holds the potentials of the bit lines BL3 and BL5 connected to the memory cells from which the data "1" have been read in the read operation at 0 V, while setting the potentials of the bit lines BL0 to BL2, BL4, BL6 and BL7 connected to the memory cells from which the data "0" have been read in the read operation to ⅔ Vcc. This period T2 is provided for applying voltages of polarity reverse to that of the voltages applied to the memory cells (nonselected memory cells) of the third and fourth cell regions in the subsequent period T3 (period for rewriting the data "1" in the memory cells of the second cell regions). In other words, the polarization states of the memory cells of the third and fourth cell regions, deteriorated (improved) in the period T2, are improved (deteriorated) in the period T3.

Figure 14:
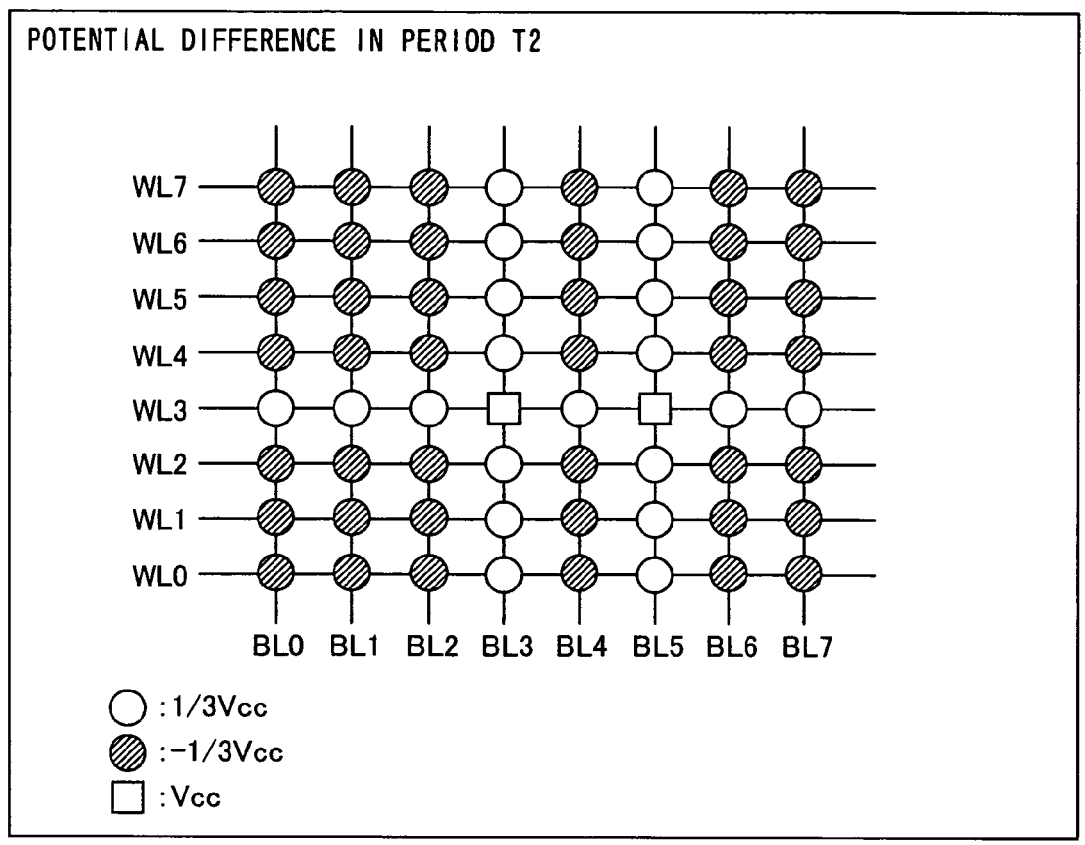
FIG. 14 is a distribution diagram showing potential differences caused in the memory cell array of the ferroelectric memory according to the first embodiment of the present invention.

FIG. 14 shows potential differences caused in the memory cells of the first to fourth cell regions in the period T2. The ferroelectric memory applies ⅓ Vcc to the memory cells (selected memory cells) of the first cell regions and the memory cells (nonselected memory cells) of the third cell regions, while applying Vcc and −⅓ Vcc to the memory cells (selected memory cells) of the second cell regions and the memory cells (nonselected memory cells) of the fourth memory cells respectively. After a lapse of the period T2, the ferroelectric memory sets the potentials of all word lines WL0 to WL7 and the bit lines BL0 to BL2, BL4, BL6 and BL7 to 0 V (standby state).

Figure 15:
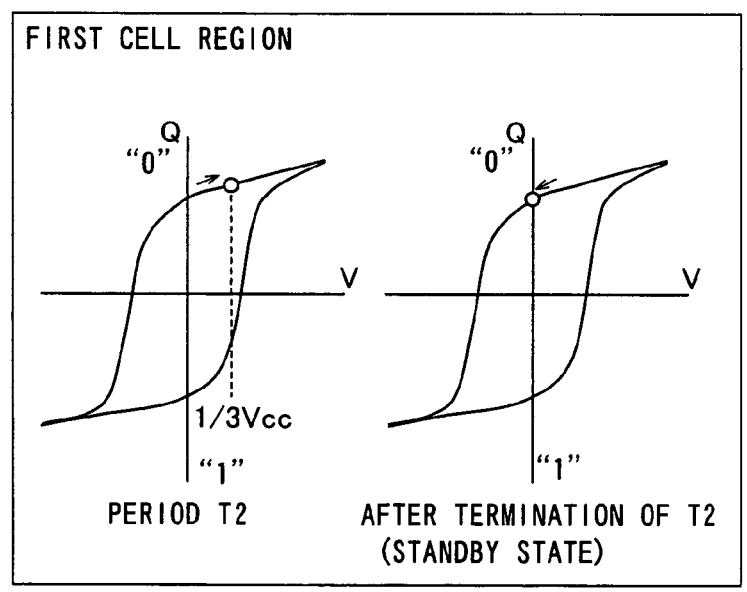
FIGS. 15 to 18 are hysteresis diagrams showing polarization states of the memory cells of the ferroelectric memory according to the first embodiment of the present invention.
Figure 16:
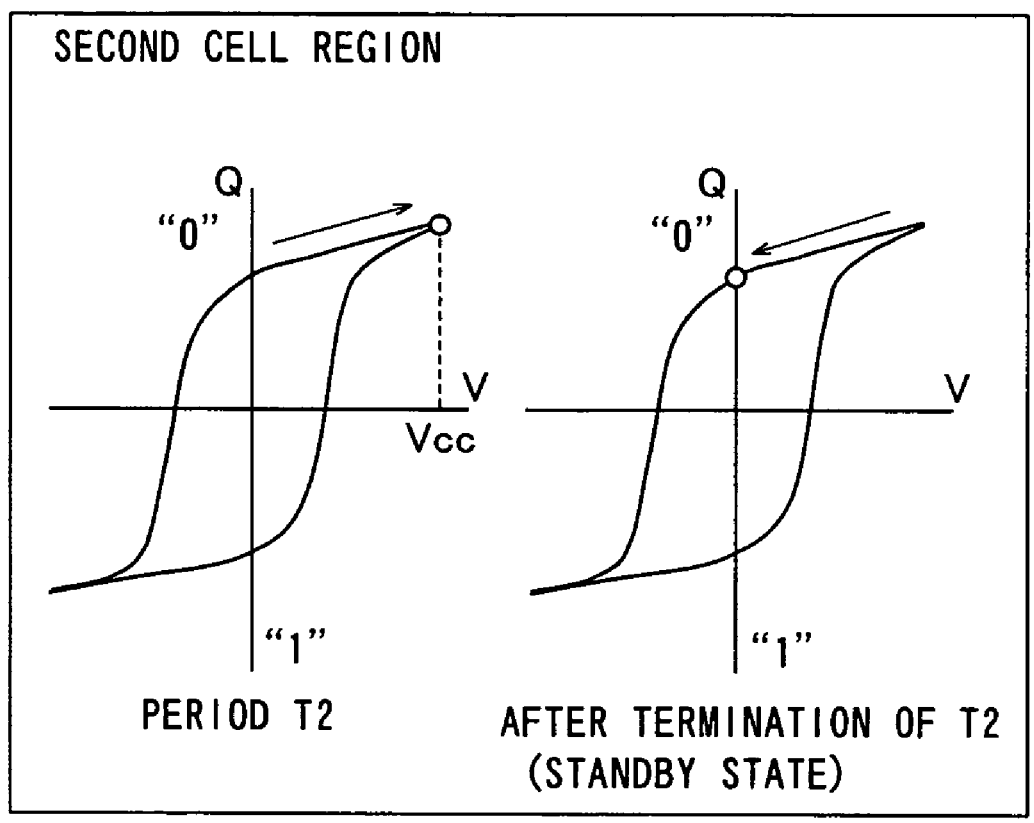

FIGS. 15 and 16 show polarization changes of the memory cells (selected memory cells) of the first and second cell regions in the period T2 respectively. The polarization states of the memory cells of the first cell regions having stored the data "0" are improved due to application of the voltage ⅓ Vcc, as shown in FIG. 15. On the other hand, data "0" are rewritten in the memory cells of the second cell regions in which the data "0" have been written in the period T1 due to application of the voltage Vcc, as shown in FIG. 16.

Figure 17:
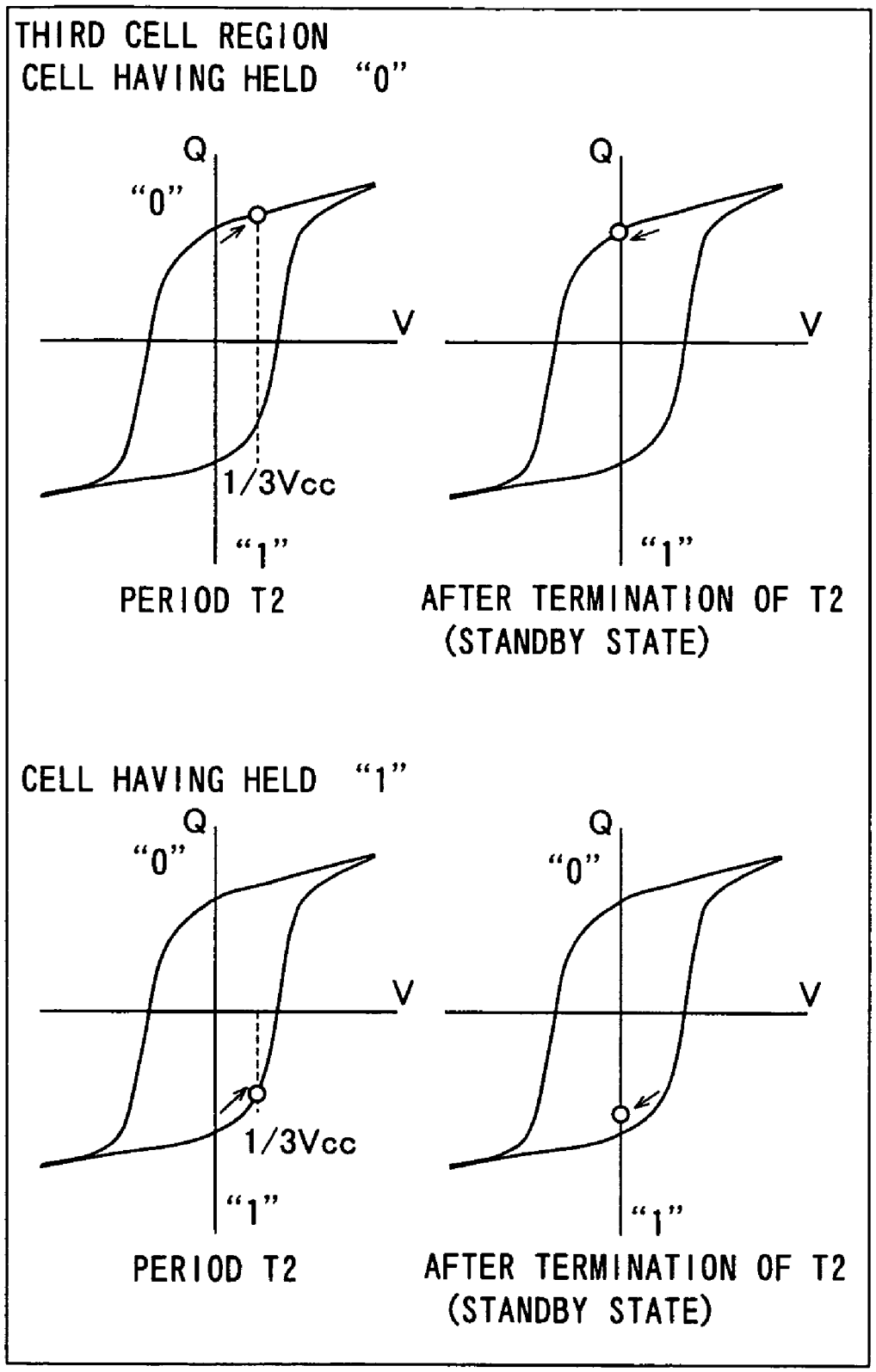
Figure 18:
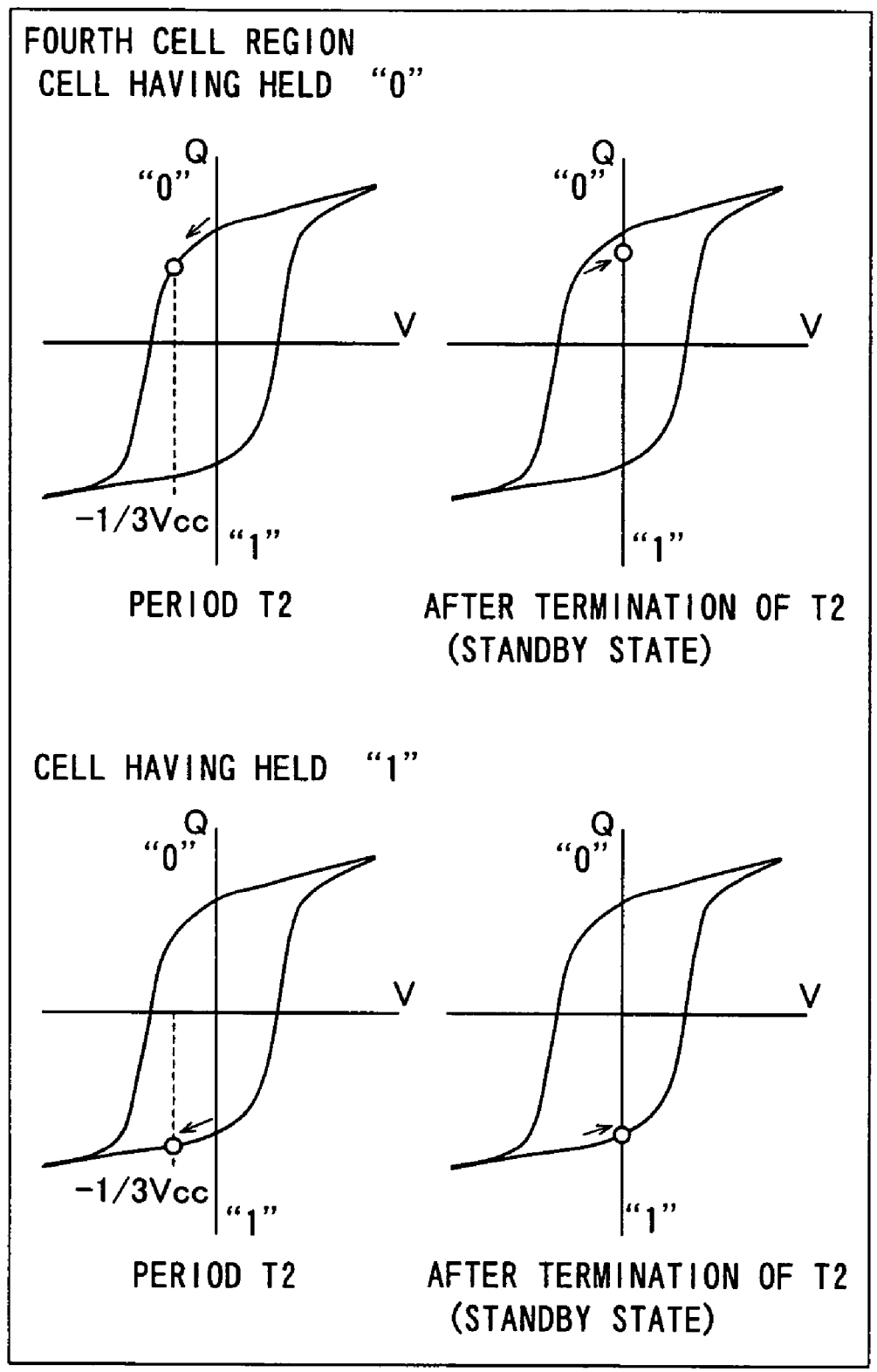

As to polarization changes of the memory cells (nonselected memory cells) of the third and fourth cell regions in the period T2, the polarization states are improved or deteriorated in response to the contents of the stored data, as shown in FIGS. 17 and 18 respectively. As shown in FIG. 17, the polarization states of the memory cells of the third cell regions are improved when the memory cells have held the data "0", while the former are deteriorated when the latter have held the data "1". As shown in FIG. 18, on the other hand, the polarization states of the memory cells of the fourth cell regions are deteriorated when the memory cells have held the data "0", while the former are improved when the latter have held the data "1".

Then, the ferroelectric memory holds the potential of the selected word line WL3 at 0 V (standby state) while setting the potentials of the nonselected word lines WL0 to WL2 and WL4 to WL7 to ⅔ Vcc in the period T3, as shown in FIG. 5. In this period T3, the ferroelectric memory further sets the potentials of the bit lines BL3 and BL5 connected to the memory cells from which the data "1" have been read in the read operation to Vcc while setting the potentials of the bit lines BL0 to BL2, BL4, BL6 and BL7 connected to the memory cells from which the data "0" have been read in the read operation to ⅓ Vcc.

Figure 19:
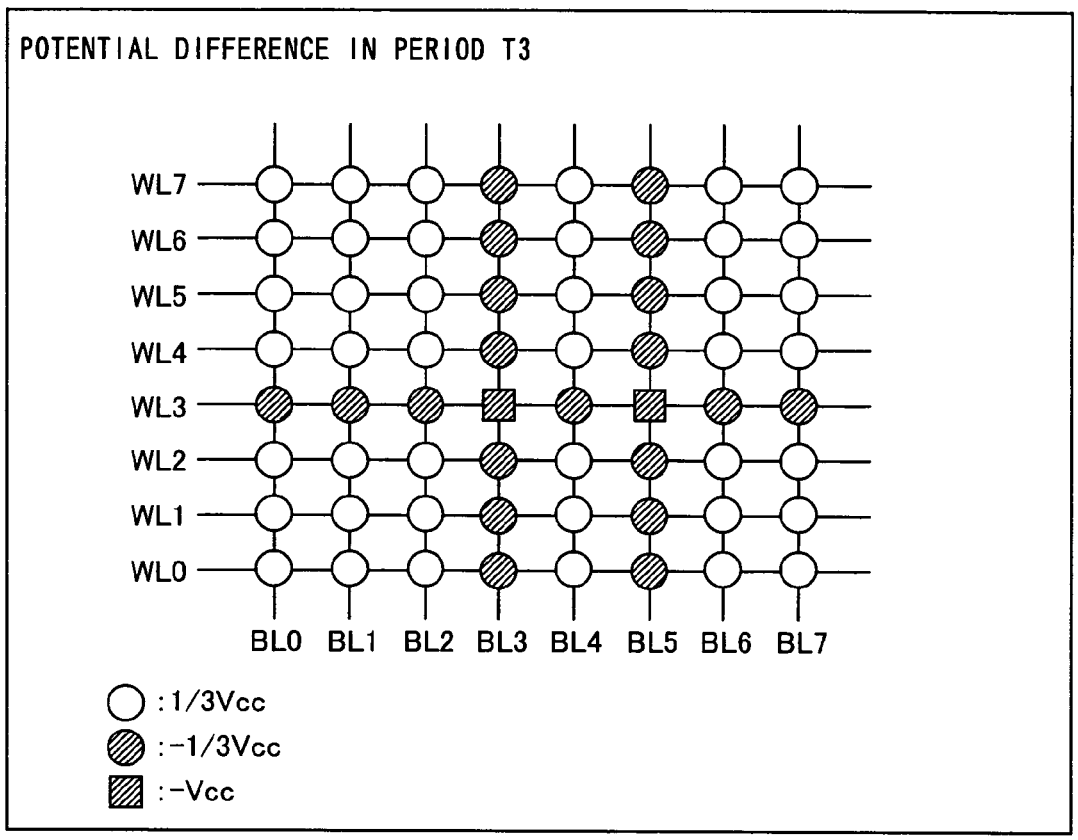
FIG. 19 is a distribution diagram showing potential differences caused in the memory cell array of the ferroelectric memory according to the first embodiment of the present invention.

FIG. 19 shows potential differences caused in the memory cells of the first to fourth cell regions in the period T3. The ferroelectric memory applies −⅓ Vcc to the memory cells (selected memory cells) of the first cell regions and the memory cells (nonselected memory cells) of the third cell regions, while applying −Vcc and ⅓ Vcc to the memory cells (selected memory cells) of the second cell regions and the memory cells (nonselected memory cells) of the fourth cell regions respectively. After a lapse of the period T3, the ferroelectric memory sets the potentials of the nonselected word lines WL0 to WL2 and WL4 to WL7 and all bit lines BL0 to BL7 to 0 V (standby state), thereby completing the series of read-rewrite operations.

Figure 20:
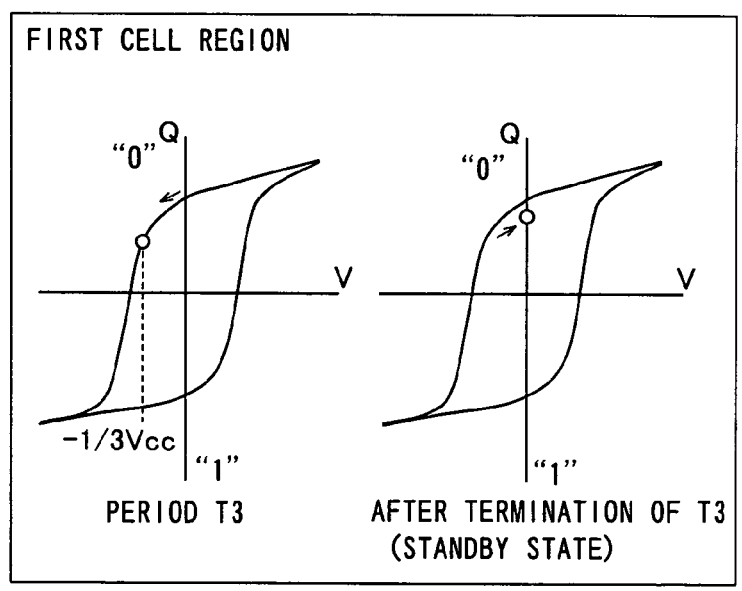
FIGS. 20 to 23 are hysteresis diagrams showing polarization states of the memory cells of the ferroelectric memory according to the first embodiment of the present invention.
Figure 21:
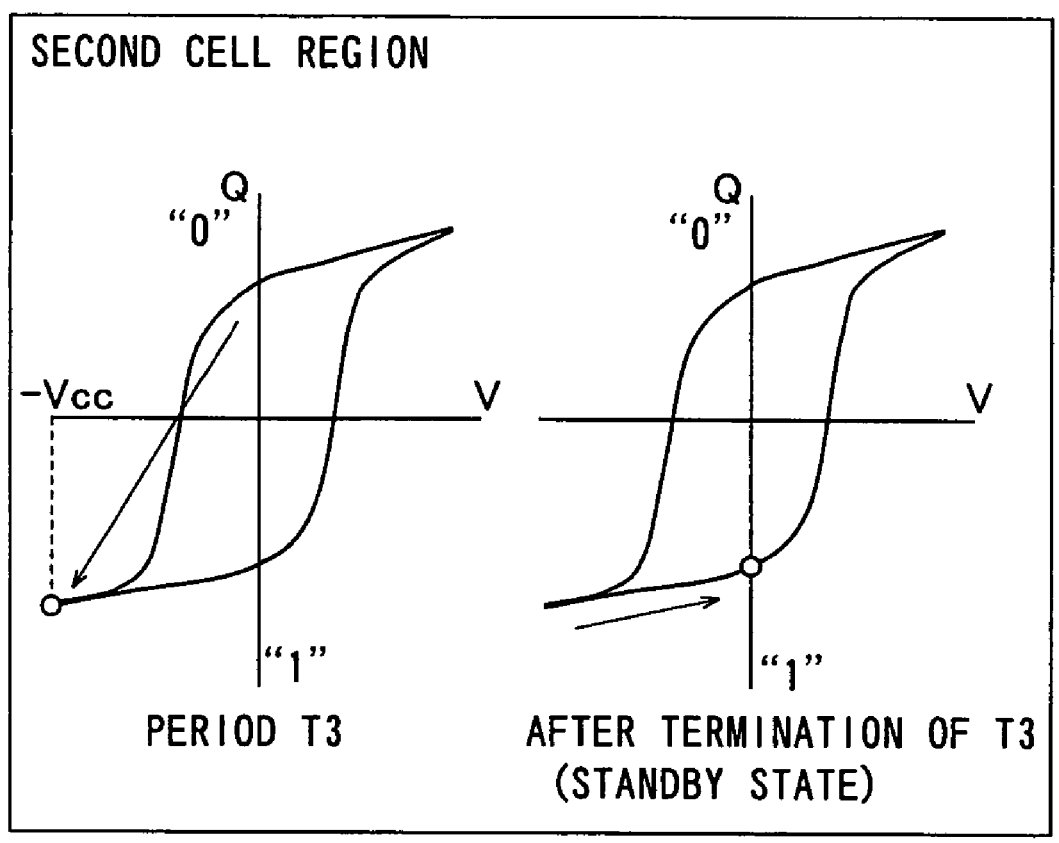

FIGS. 20 and 21 show polarization changes of the memory cells (selected memory cells) of the first and second cell regions in the period T3 respectively. As shown in FIG. 20, the polarization states of the memory cells of the first cell regions having stored the data "0" are deteriorated due to application of the voltage −⅓ Vcc. As shown in FIG. 21, the data "1" are written in the memory cells of the second cell regions in which the data "0" have been rewritten in the period T2 due to application of the voltage −Vcc. Thus, the data "1" destroyed through the read operation are completely rewritten.

Figure 22:
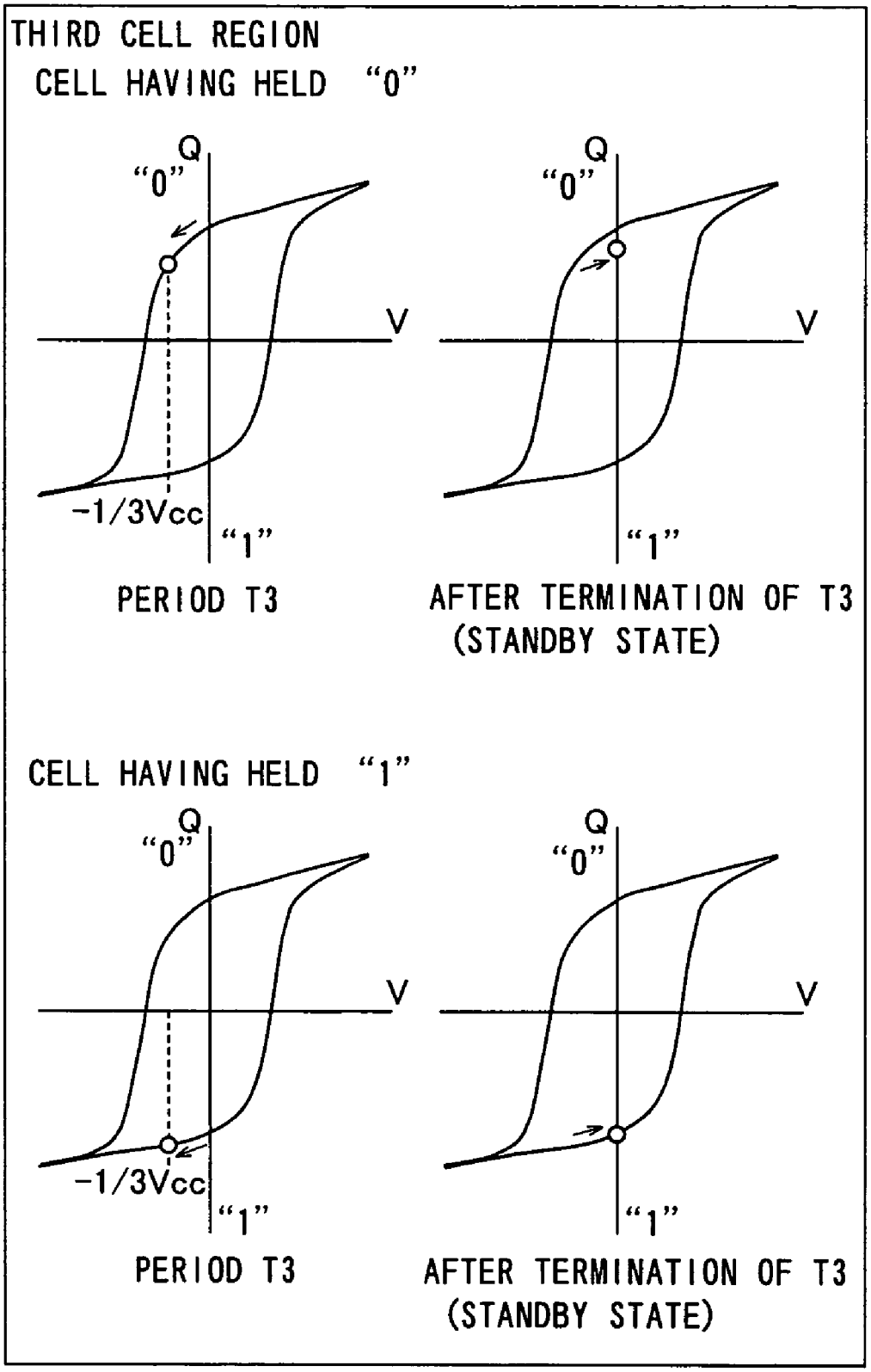
Figure 23:
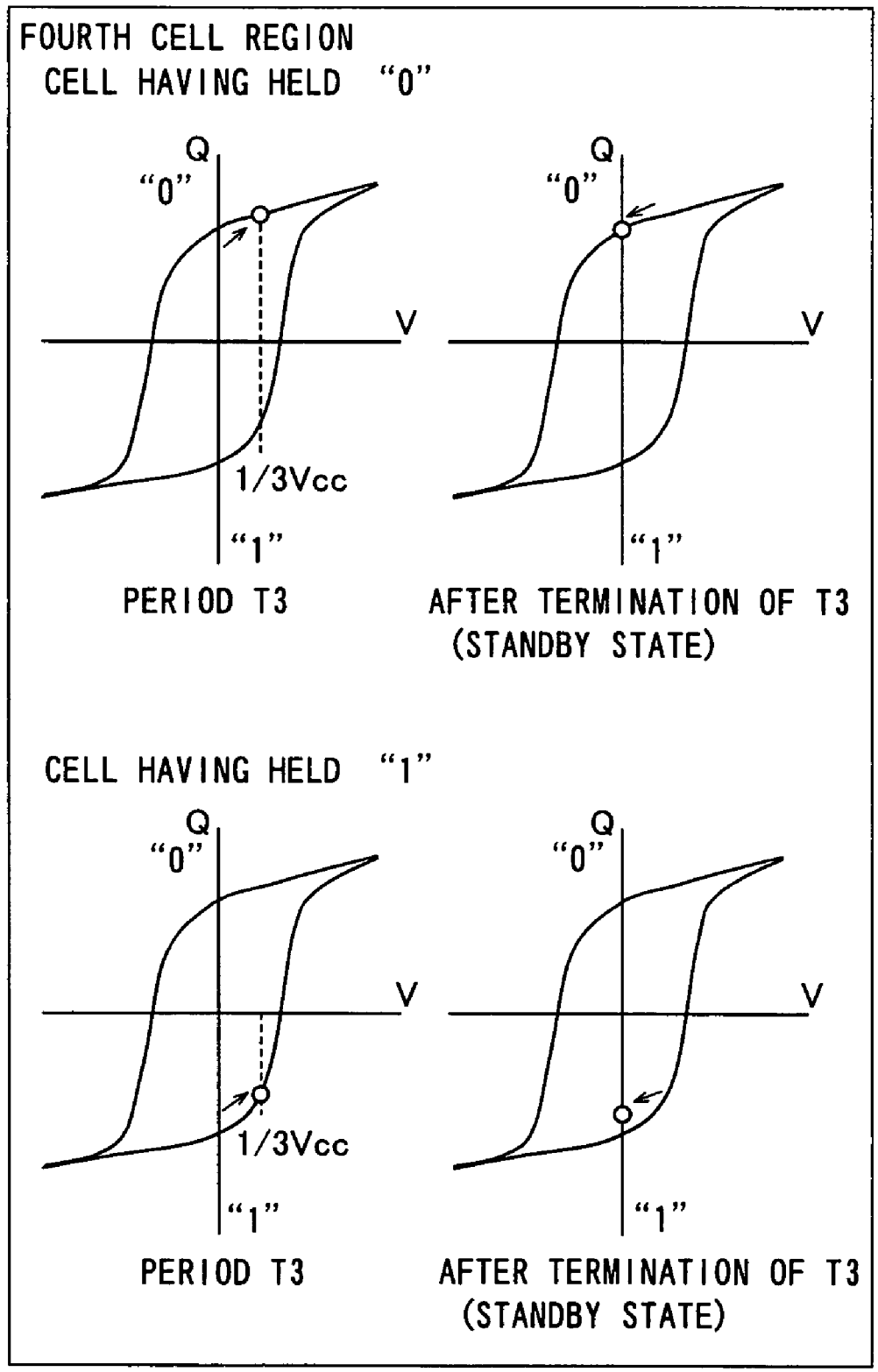

As to polarization changes of the memory cells (nonselected memory cells) of the third and fourth regions in the period T3, the polarization states are improved or deteriorated in response to the contents of the stored data as shown in FIGS. 22 and 23 respectively. As shown in FIG. 22, the polarization states of the memory cells of the third cell regions are deteriorated when the memory cells have held the data "0", while the former are improved when the latter have held the data "1". As shown in FIG. 23, on the other hand, the polarization states of the memory cells of the fourth cell regions are improved when the memory cells have held the data "0", while the former are deteriorated when the latter have held the data "1". Thus, the polarization states are improved and deteriorated by the same frequencies throughout the periods t1 (T1), Tad, T2 and T3.

According to the first embodiment, as hereinabove described, the ferroelectric memory applies the voltage Vp of polarity reverse to that of the voltages −Vr1 and −Vr0 applied to the memory cells of the third and fourth cell regions in the read operation to the memory cells (nonselected memory cells) of the third and fourth cell regions in addition to the read operation (period T1) and the rewrite operation (periods T2 and T3) collectively performed on the memory cells (selected memory cells) of the first and second cell regions, so that the polarization states of the memory cells of the third and fourth cell regions can be improved also when the same are deteriorated due to application of the voltages −Vr1 and −Vr0 thereto in the read operation. Further, the ferroelectric memory applies the voltages reversed in polarity to each other to the memory cells of the third and fourth regions by the same frequencies throughout the read operation (periods T1 and Tad) and the rewrite operation (periods T2 and T3) so that the polarization states of the memory cells of the third and fourth regions are deteriorated and improved by the same frequencies throughout the read operation and the rewrite operation, whereby the polarization states of the memory cells of the third and fourth regions can be inhibited from deterioration. Also when the ferroelectric memory repeats the read and rewrite operations, therefore, no deterioration of the polarization states of the memory cells of the third and fourth cell regions is accumulated and hence the ferroelectric memory can reliably prevent disturbance causing disappearance of the data "1" or "0" held in the memory cells of the third and fourth cell regions. Also when the polarization states of the memory cells are dispersed, further, no deterioration of the polarization states of the memory cells of the third and fourth cell regions is accumulated and hence partial memory cells of the third and fourth cell regions having small quantities of polarization can be inhibited from further deterioration of the polarization states. Thus, the ferroelectric memory causes no inconvenience of disappearance of only the data of the memory cells of the third and fourth cell regions having small quantities of polarization.

Figure 24:
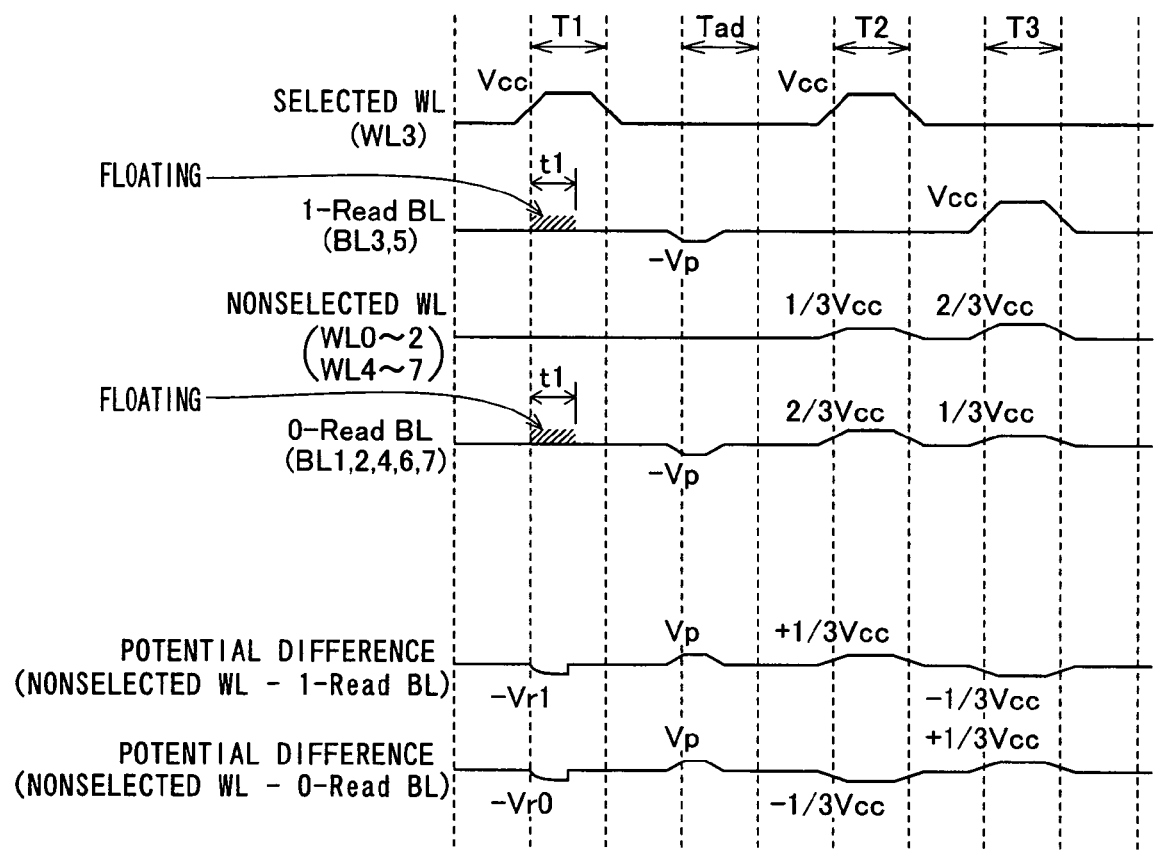
FIG. 24 is a voltage waveform diagram for illustrating read-rewrite operations of a ferroelectric memory according to a modification of the first embodiment.

FIG. 24 illustrates read-rewrite operations of a ferroelectric memory according to a modification of the first embodiment of the present invention. Referring to FIG. 24, the ferroelectric memory according to the modification of the first embodiment holds the potentials of nonselected word lines WL0 to WL2 and WL4 to WL7 at 0 V and sets the potentials of all bit lines BL0 to BL7 to −Vp in a period Tad dissimilarly to the ferroelectric memory according to the first embodiment changing the potentials of the nonselected word lines WL0 to WL2 and WL4 to WL7 in the period Tad, thereby applying a voltage Vp of polarity reverse to that of −Vr1 and −Vr0 to memory cells (nonselected memory cells) of third and fourth cell regions. Also in this structure, the ferroelectric memory can vary the polarization states of the memory cells (nonselected memory cells) of the third and fourth cell regions in the period Tad similarly to those of the first embodiment shown in FIG. 12.

Second Embodiment

Figure 25:
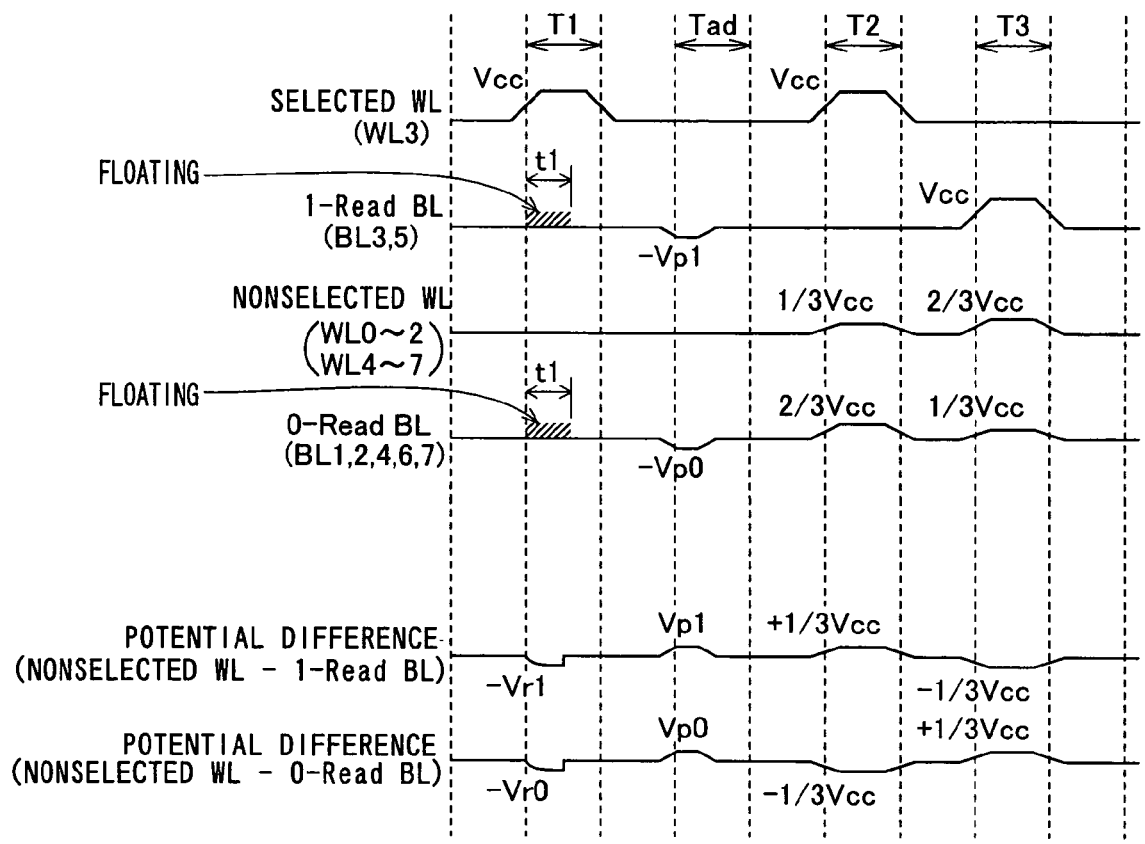
FIG. 25 is a voltage waveform diagram for illustrating read-rewrite operations of a ferroelectric memory according to a second embodiment of the present invention.
Figure 26:
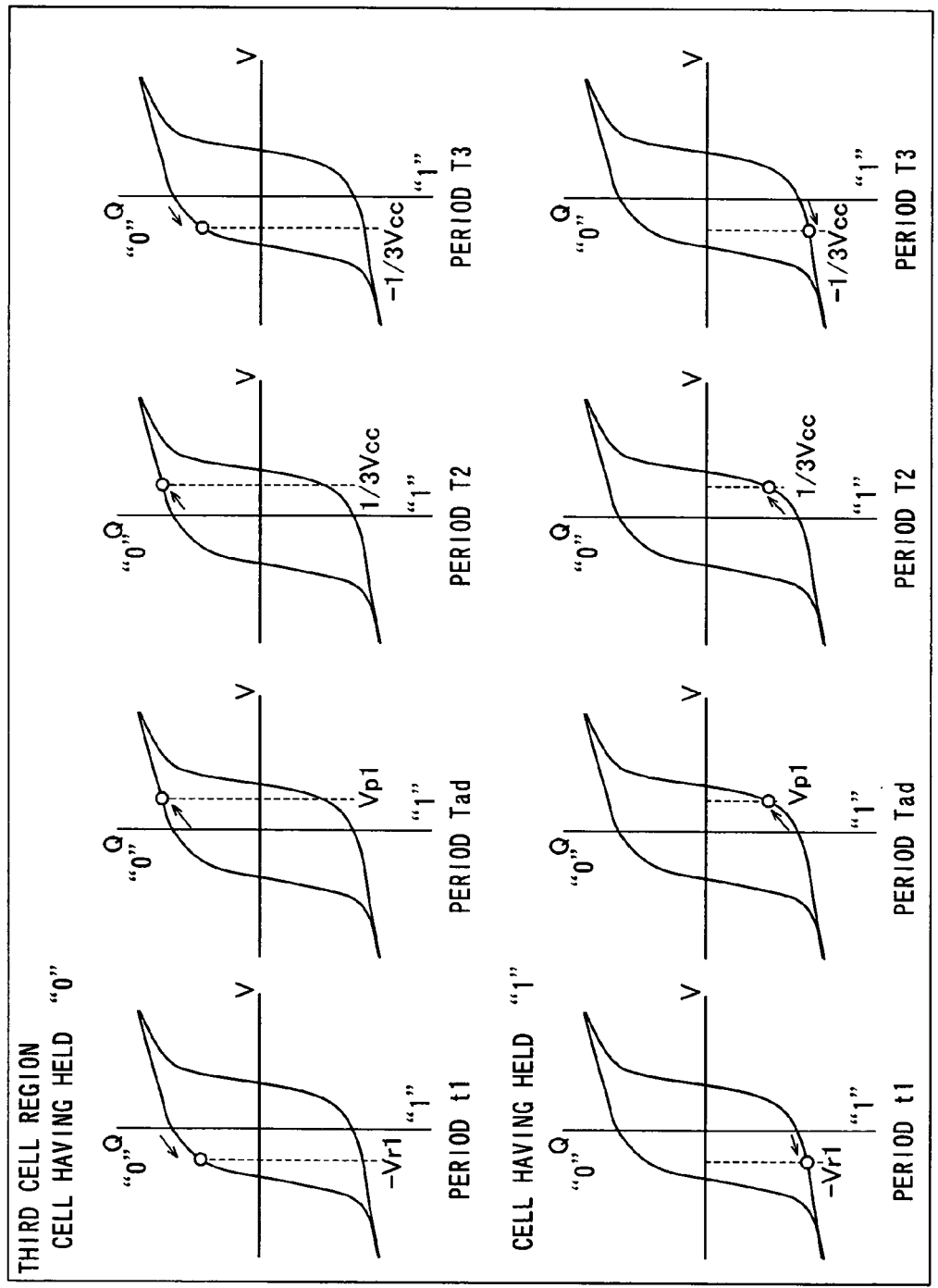
FIGS. 26 and 27 are hysteresis diagrams showing polarization states of memory cells of the ferroelectric memory according to the second embodiment of the present invention.
Figure 27:
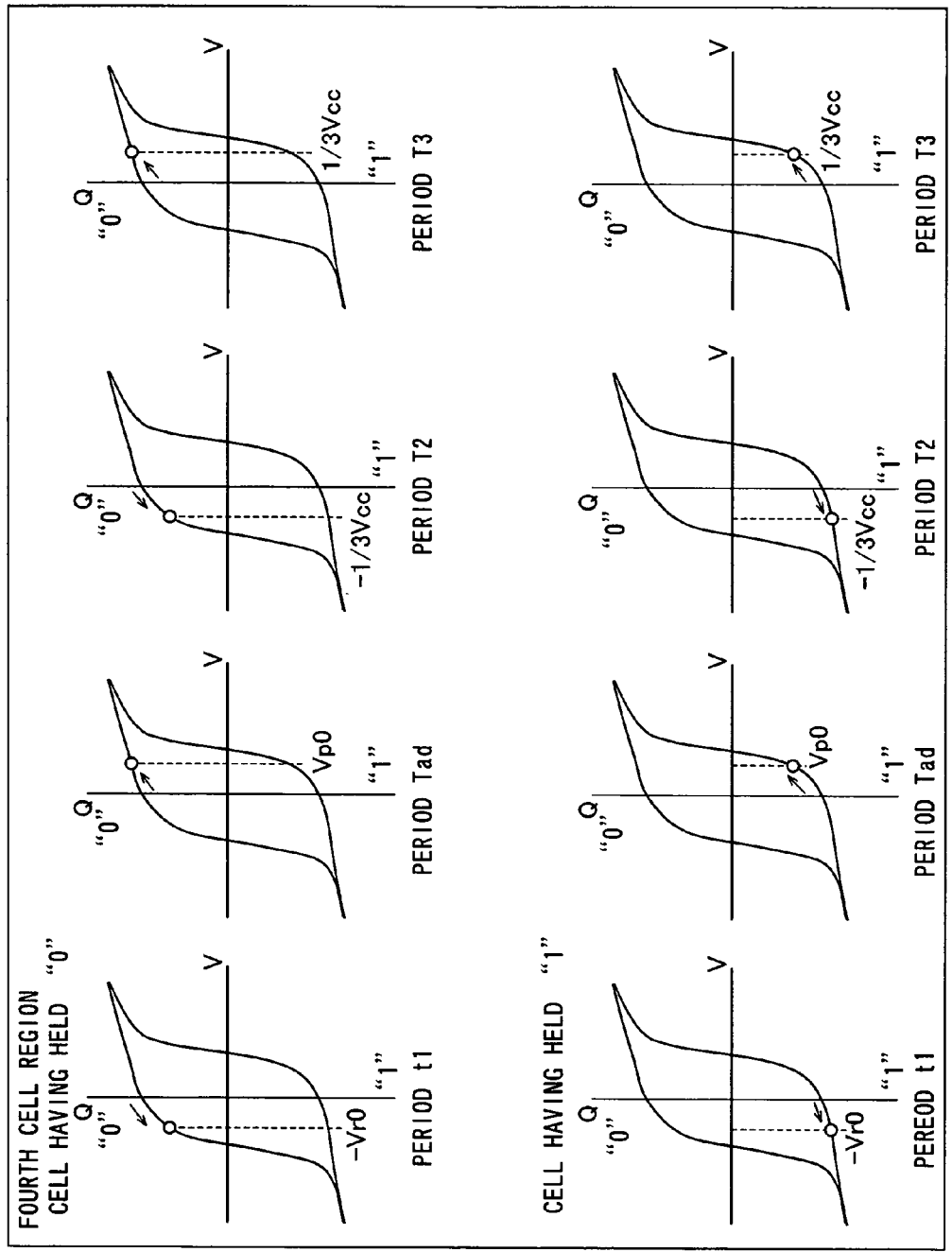

Referring to FIGS. 25 to 27, a ferroelectric memory according to a second embodiment of the present invention is described with reference to a case of applying different voltages to memory cells (nonselected memory cells) of third and fourth cell regions in a period Tad dissimilarly to the aforementioned first embodiment. The ferroelectric memory according to the second embodiment operates in periods T1, T2 and T3 similarly to the ferroelectric memory according to the aforementioned first embodiment.

(Period Tad)

As shown in FIG. 25, the ferroelectric memory according to the second embodiment sets the potentials of all word lines WL0 to WL7 and all bit lines BL0 to BL7 to 0 V (standby state) while setting the potentials of the bit lines BL3 and BL5 connected to memory cells from which data "1" have been read in a read operation to −Vp1 after a lapse of the period T1. The ferroelectric memory further sets the potentials of the bit lines BL0 to BL2, BL4, BL6 and BL7 connected to memory cells from which data "0" have been read in the read operation to −Vp0. Vp1 and Vp0 satisfy the following relational expression:

$$Vp1 > Vp0$$

According to the second embodiment, Vp1 and Vp0 are set to satisfy the following relational expressions respectively:

$$Vp1 \approx Vr1$$

$$Vp0 \approx Vr0$$

Thus, the ferroelectric memory applies the voltages Vp1 and Vp0 of polarity reverse to that of the voltages −Vp1 and −Vp0 applied in the period T1 (read operation) to the memory cells (nonselected memory cells) of the third and fourth cell regions respectively. The voltages Vp1 and Vp0 are examples of the "third voltage" and the "fourth voltage" in the present invention respectively. After a lapse of the period Tad, the ferroelectric memory sets the potentials of all bit lines BL0 to BL7 to 0 V (standby state). In the period T1 (read operation) and the periods T2 and T3 (rewrite operation), the ferroelectric memory applies voltages to the memory cells of the first to fourth cell regions similarly to the ferroelectric memory according to the aforementioned first embodiment.

As to polarization changes of the memory cells (nonselected memory cells) of the third and fourth regions in the periods t1 (T1), Tad, T2 and T3, the polarization states are improved or deteriorated in response to the contents of stored data as shown in FIGS. 26 and 27 respectively. As shown in FIG. 26, the polarization states of the memory cells of the third cell regions are improved and deteriorated in the periods t1 (T1) and Tad respectively and improved and deteriorated in the periods T2 and T3 respectively when the memory cells have held data "0". When the memory cells of the third cell regions have held data "1", on the other hand, the polarization states are improved and deteriorated in the periods t1 (T1) and Tad respectively, and deteriorated and improved in the periods T2 and T3 respectively.

As shown in FIG. 27, the polarization states of the memory cells of the fourth cell regions are deteriorated and improved in the periods t1 (T1) and Tad respectively and deteriorated and improved in the periods T2 and T3 respectively when the memory cells have held data "0". When the memory cells of the fourth cell regions have held data "1", on the other hand, the polarization states are improved and deteriorated in the periods t1 (T1) and Tad respectively, and improved and deteriorated in the periods T2 and T3 respectively.

According to the second embodiment, as hereinabove described, the ferroelectric memory, substantially equalizing the voltage Vp1 applied to the memory cells (nonselected memory cells) of the third cell regions in the period Tad with the voltage Vr1 having been applied to the memory cells of the third cell regions in the read operation while substantially equalizing the voltage Vp0 applied to the memory cells (nonselected memory cells) of the fourth cell regions in the period Tad with the voltage Vr0 having been applied to the memory cells of the fourth cell regions in the read operation, can substantially equalize quantities of polarization of the memory cells of the third cell regions reduced in the read operation with those recovered in the period Tad and substantially equalize quantities of polarization of the memory cells of the fourth cell regions reduced in the read operation with those recovered in the period Tad. Consequently, the ferroelectric memory can further improve the balance between reduction and recovery of the quantities of polarization of the memory cells of the third and fourth cell regions respectively.

According to the second embodiment, further, the ferroelectric memory, applying the voltages Vp1 and Vp0 of polarity reverse to that of the voltages −Vr1 and −Vr0 applied to the memory cells of the fourth cell regions in the read operation respectively, can suppress disturbance causing disappearance of the data "1" or "0" held in the memory cells of the third and fourth cell regions through the read operation (period T1) similarly to the ferroelectric memory according to the aforementioned first embodiment. In addition, the ferroelectric memory, applying the voltages reversed in polarity to each other to the memory cells (nonselected memory cells) of the third and fourth cell regions by the same frequencies throughout the read operation (periods T1 and Tad) and the rewrite operation (periods T2 and T3), can reliably suppress disturbance of the nonselected memory cells in the series of read and rewrite operations similarly to the ferroelectric memory according to the aforementioned first embodiment.

Third Embodiment

Figure 28:
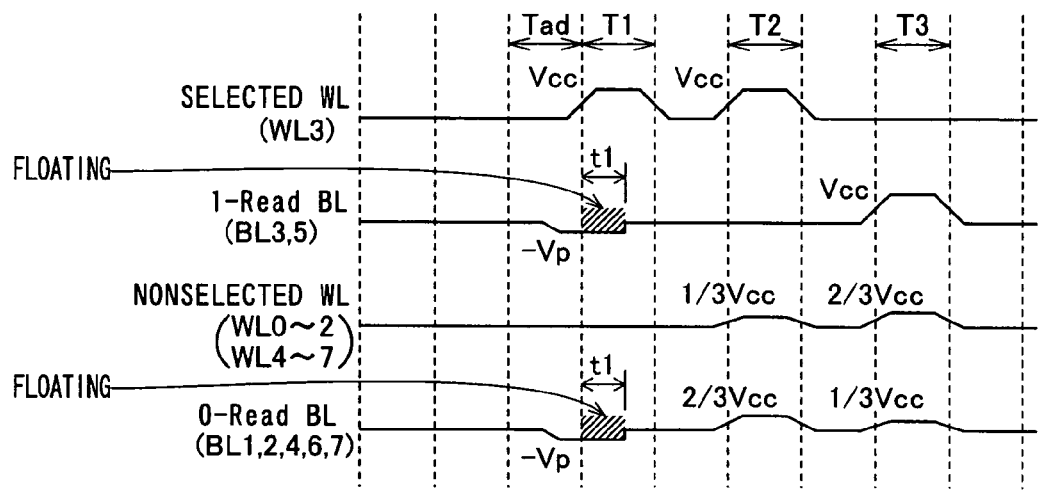
FIG. 28 is a voltage waveform diagram for illustrating read-rewrite operations of a ferroelectric memory according to a third embodiment of the present invention.
Figure 29:
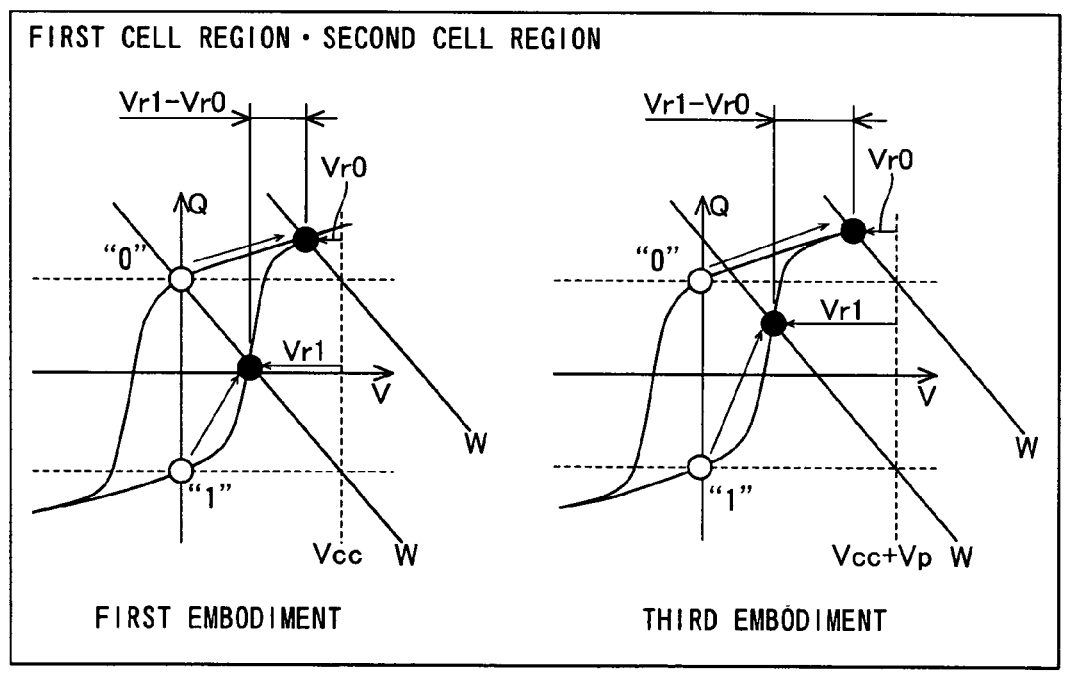
FIGS. 29 to 31 are hysteresis diagrams showing polarization states of memory cells of the ferroelectric memory according to the third embodiment of the present invention.

FIGS. 28 to 31 are diagrams showing read-rewrite operations and polarization states of memory cells in a ferroelectric memory according to a third embodiment of the present invention. In the ferroelectric memory according to the third embodiment, a period Tad is provided immediately before a period T1, dissimilarly to the ferroelectric memories according to the aforementioned first and second embodiments. Referring to FIG. 29, symbol W denotes Q-V lines showing wiring load capacities between bit lines and a voltage sense amplifier. The ferroelectric memory according to the third embodiment operates in periods T2 and T3 similarly to the ferroelectric memory according to the aforementioned first embodiment.

(Period Tad)

According to the third embodiment, the ferroelectric memory first applies voltages of polarity reverse to that of voltages applied to memory cells (nonselected memory cells) of third and fourth cell regions in the subsequent period T1, as shown in FIG. 28. More specifically, the ferroelectric memory sets the potentials of all bit lines BL0 to BL7 from 0 V (standby state) to −Vp. Further, the ferroelectric memory further holds all word lines WL0 to WL7 at 0 V, thereby applying the voltage Vp of polarity reverse to that of −Vr1 and −Vr0 to the memory cells of the third and fourth cell regions.

(Period T1: Read Operation)

According to the third embodiment, the ferroelectric memory reads data immediately after the period Tad. In other words, the ferroelectric memory brings all bit lines BL0 to BL7 into floating states while setting the potential of a selected word line WL3 to Vcc at the same timing or in a delay by several nsec. to several 10 nsec. without through a standby state following the period Tad. The ferroelectric memory further holds nonselected word lines WL0 to WL2 and WL4 to WL7 at 0 V. Thus, the ferroelectric memory applies a voltage (Vcc+Vp) to memory cells (selected memory cells) of first and second cell regions in the read operation as shown in FIG. 29, dissimilarly to the ferroelectric memory according to the first embodiment applying the voltage Vcc to the memory cells of the first and second cell regions. According to the third embodiment, therefore, the potential difference (Vr1−Vr0) between the read potentials Vr1 and Vr0 is larger than that in the aforementioned first embodiment. In the periods T2 and T3 (rewrite operation), the ferroelectric memory applies voltages to the memory cells of the first to fourth cell regions similarly to the ferroelectric memory according to the aforementioned first embodiment.

Figure 30:
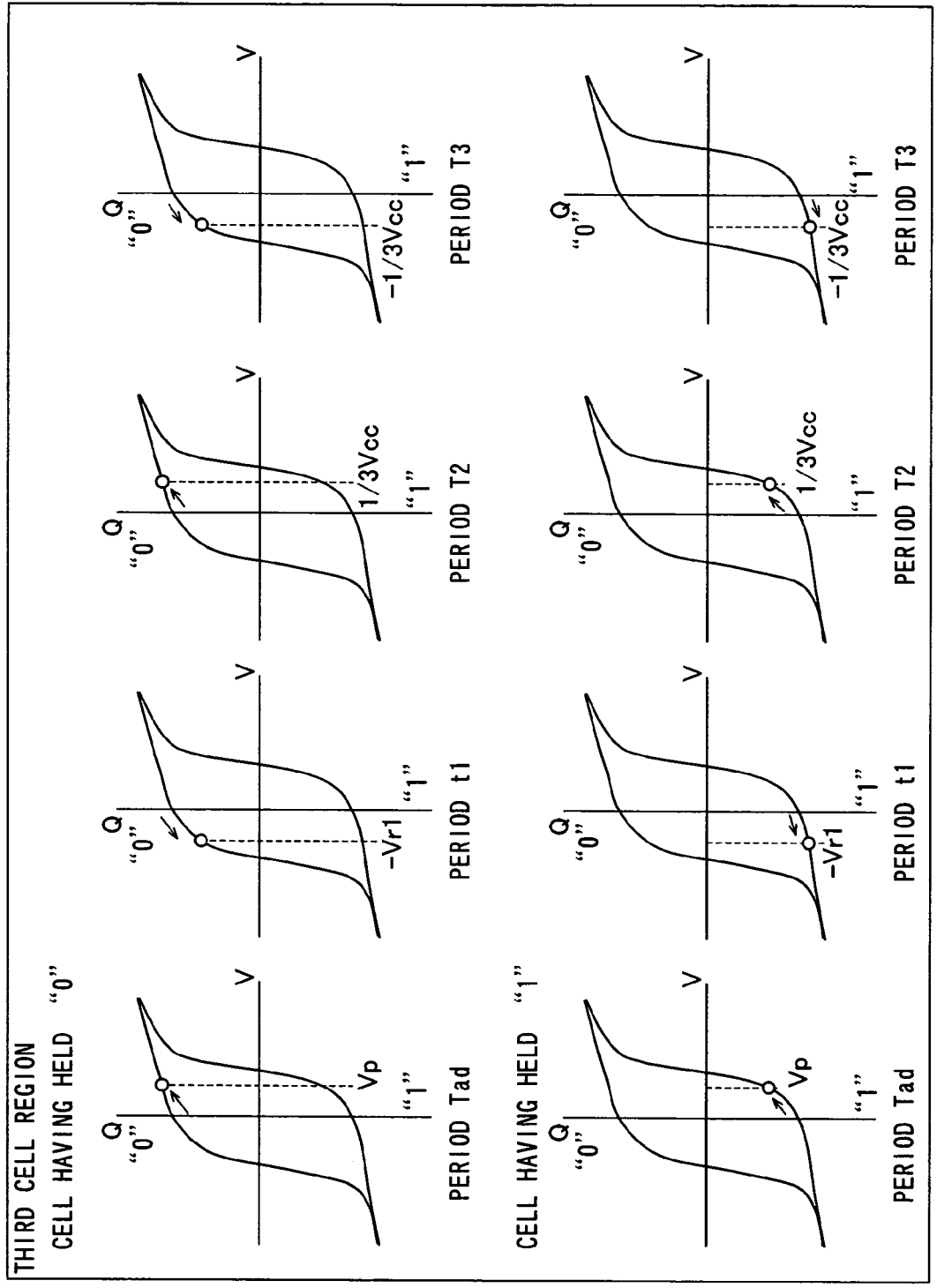
Figure 31:
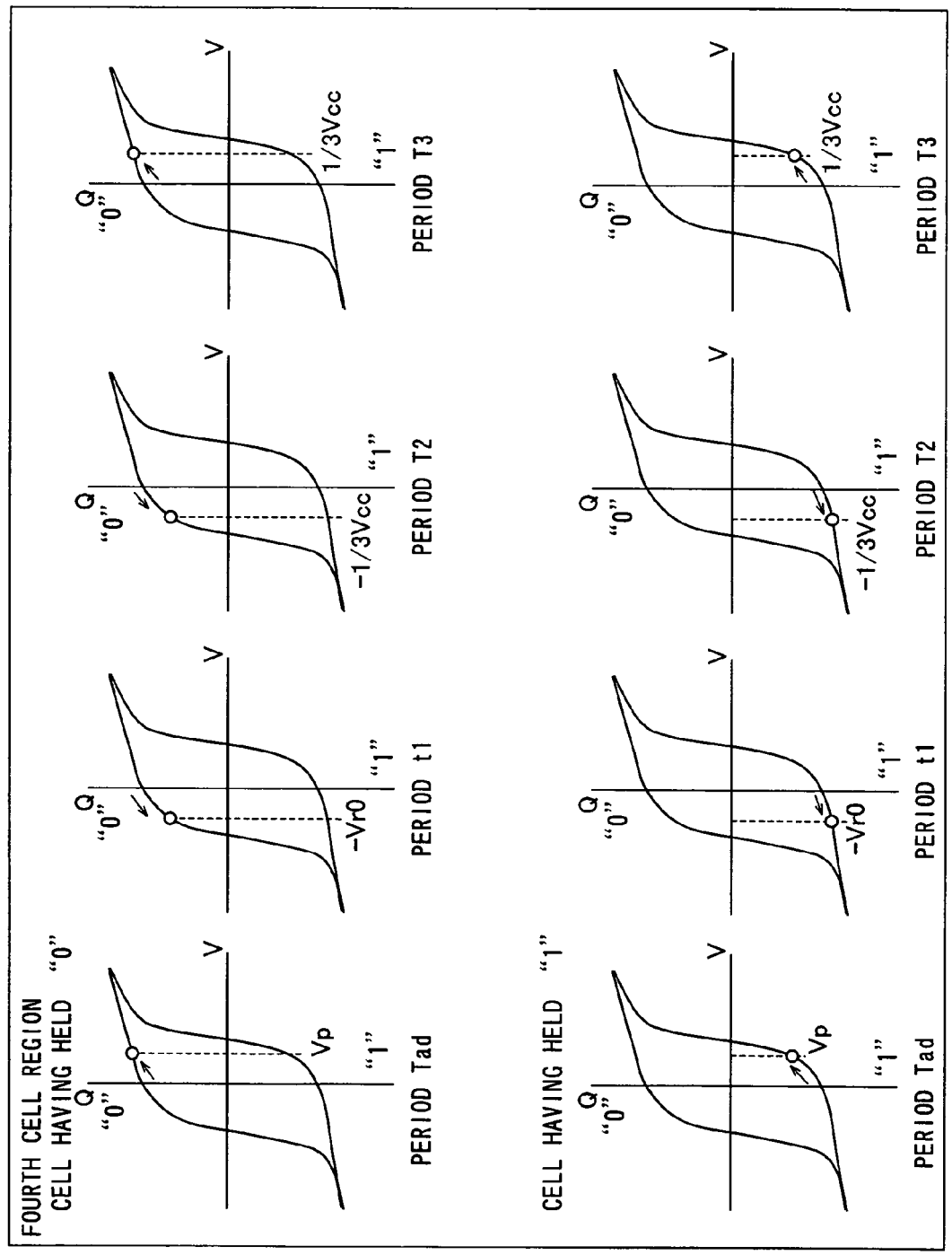

As to polarization changes of the memory cells (nonselected memory cells) of the third and fourth cell regions in the periods t1 (T1), Tad, T2 and T3, the polarization states are improved or deteriorated in response to the contents of stored data as shown in FIGS. 30 and 31 respectively. As shown in FIG. 30, the polarization states of the memory cells of the third cell regions are improved and deteriorated in the periods Tad and t1 (T1) respectively and also improved and deteriorated in the periods T2 and T3 respectively when the memory cells have held the data "0". When the memory cells of the third cell regions have held the data "1", on the other hand, the polarization states are deteriorated and improved in the periods Tad and t1 (T1) respectively, and also deteriorated and improved in the periods T2 and T3 respectively.

As shown in FIG. 31, the polarization states of the memory cells of the fourth cell regions are improved and deteriorated in the periods Tad and t1 (T1) respectively and deteriorated and improved in the periods T2 and T3 respectively when the memory cells have held the data "0". When the memory cells of the fourth cell regions have held the data "1", on the other hand, the polarization states are deteriorated and improved in the periods Tad and t1 (T1) respectively, and improved and deteriorated in the periods T2 and T3 respectively. Thus, the polarization states are improved and deteriorated by the same frequencies throughout the periods Tad, t1 (T1), T2 and T3.

According to the third embodiment, as hereinabove described, the ferroelectric memory, bringing all bit lines BL0 to BL7 into floating states and applying the voltage Vcc for reading the data "1" and "0" to the selected word line WL3 immediately after applying the voltage Vp of polarity reverse to that of the voltages −Vr1 and −Vr0 applied to the memory cells (nonselected memory cells) of the third and fourth cell regions in the read operation to the third and fourth cell regions, can apply a voltage (Vcc+Vp) exceeding the voltage Vcc for reading the data "1" and "0" to the memory cells (selected memory cells) of the first and second cell regions. Thus, the potential difference between the read potentials Vr1 and Vr0 for the data "1" and "0" can be increased for improving reading accuracy of the ferroelectric memory.

The remaining effects of the ferroelectric memory according to the third embodiment are similar to those of the ferroelectric memory according to the aforementioned first embodiment.

Fourth Embodiment

Figure 32:
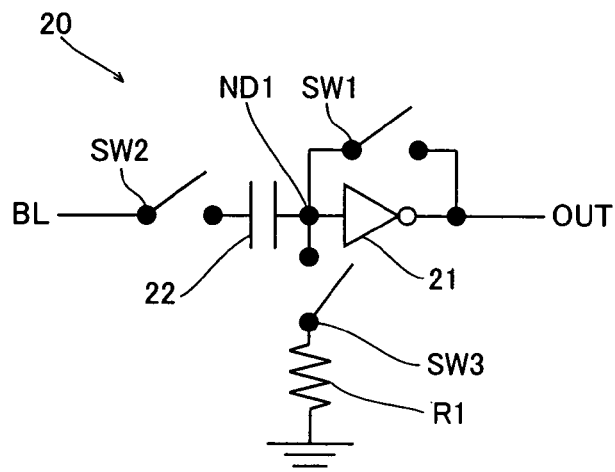
FIG. 32 is a circuit diagram showing the internal structure of a chopper comparator of a ferroelectric memory according to a fourth embodiment of the present invention.

FIG. 32 is a circuit diagram showing the internal structure of a chopper comparator 20 of a ferroelectric memory according to a fourth embodiment of the present invention. The ferroelectric memory according to the fourth embodiment determines data "0" or "1" without a reference voltage, dissimilarly to the ferroelectric memories according to the aforementioned first to third embodiments.

According to the fourth embodiment, the chopper comparator 20 shown in FIG. 32 is connected to all bit lines BL0 to BL7. This chopper comparator 20 has a function of determining data "0" or "1" stored in each memory cell. The chopper comparator 20 includes an inverter circuit 21, a capacitor 22, a resistor R1 and three switches SW1 to SW3. The inverter circuit 21 has a logical threshold potential VT. The inverter circuit 21 has an input terminal connected to a bit line BL through the capacitor 22 and the switch SW2 and an output terminal outputting data. First and second terminals of the switch SW1 are connected to the input and output terminals of the inverter circuit 21 respectively. The resistor R1 has a grounded first terminal and a second terminal connected to the output terminal of the inverter circuit 21 through the switch SW3. The resistance value of the resistor R1 is so set that a potential drop of a node ND1 is larger than 0 V and smaller than (−Vr1a+Vr1). (−Vr1a+Vr1) is described later with reference to read-rewrite operations.

The read-rewrite operations of the ferroelectric memory according to the fourth embodiment are described with reference to FIGS. 32 to 37. According to the fourth embodiment, the ferroelectric memory sets the potentials of all word lines WL0 to WL7 and all bit lines BL0 to BL7 to the logical threshold potential VT of the inverter circuit 21 in a standby state.

(Period Tad)

Figure 33:
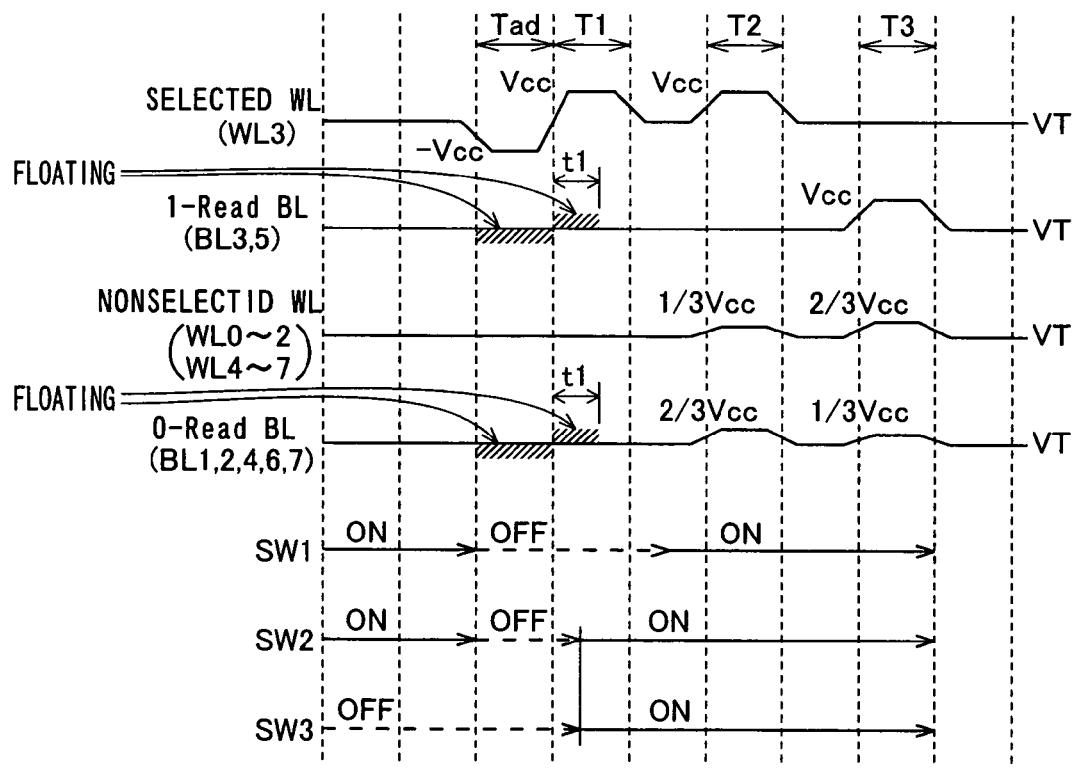
FIG. 33 is a voltage waveform diagram for illustrating read-rewrite operations of the ferroelectric memory according to the fourth embodiment of the present invention.

According to the fourth embodiment, the ferroelectric memory turns on the off-state switches SW1 and SW2, while bringing the potentials of all bit lines BL0 to BL7 from VT (standby state) into floating states and converting the potential of a selected word line WL3 from VT (standby state) to (VT−Vcc) at the same timing or in a delay of several nsec. to several 10 nsec. in a period Tad, as shown in FIG. 33. The ferroelectric memory further holds nonselected word lines WL0 to WL2 and WL4 to WL7 at VT. At this time, the potentials of the bit lines BL3 and BL5 reach (VT−Vr1a), while those of the bit lines BL0 to BL2, BL4, BL6 and BL7 reach (VT−Vr0a). (VT−Vcc) (potential of the selected word line WL3) is an example of the "fifth voltage" in the present invention.

Figure 34:
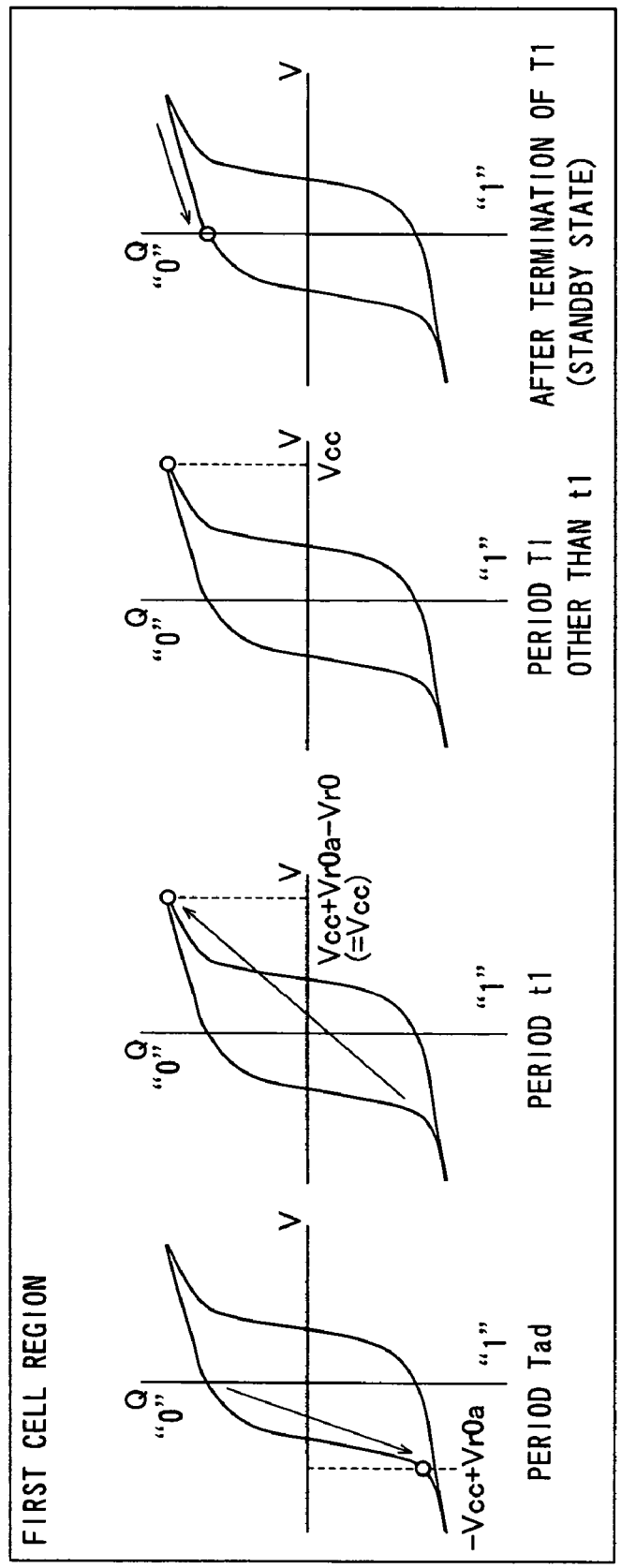
FIGS. 34 to 37 are hysteresis diagrams showing polarization states of memory cells of the ferroelectric memory according to the fourth embodiment of the present invention.
Figure 35:
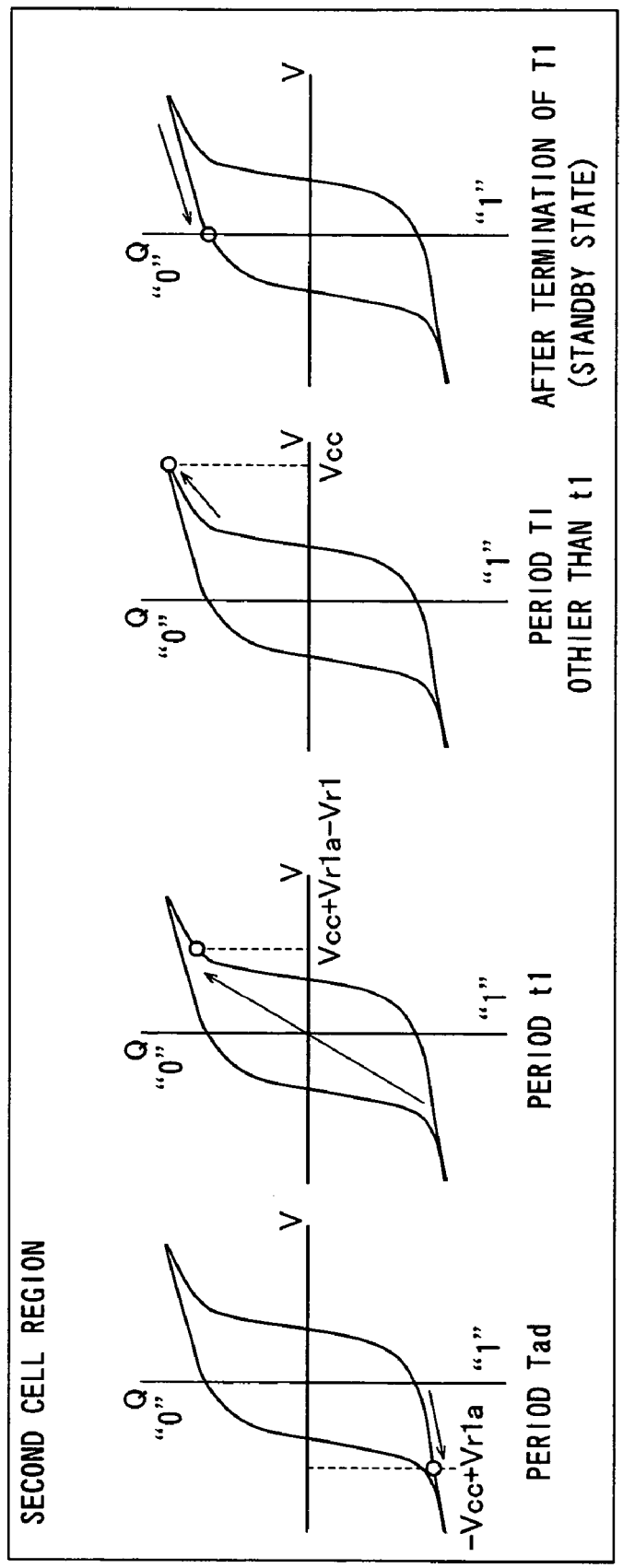

FIGS. 34 and 35 show polarization changes of memory cells (selected memory cells) of first and second cell regions in the period Tad respectively. As shown in FIG. 34, the memory cells of the first cell regions having held data "0" are polarization-inverted due to application of a voltage (−Vcc+Vr0a). As shown in FIG. 35, the memory cells of the second cell regions having held data "1" are not polarization-inverted due to application of a voltage (−Vcc+Vr1a).

(Period T1: Read Operation)

Then, the ferroelectric memory sets the potential of the selected word line WL3 to (VT+Vcc) while holding all bit lines BL0 to BL7 in floating states for a period t1. The ferroelectric memory further holds the nonselected word lines WL0 to WL2 and WL4 to WL7 at VT. At this time, the potentials of the bit lines BL3 and BL5 reach a read potential (VT−Vr1a+Vr1) while the potentials of the bit lines BL0 to BL2, BL4, BL6 and BL7 reach a read potential (VT−Vr0a+Vr0). (VT+Vcc) (potential of the selected word line WL3) is an example of the "sixth voltage" in the present invention. After the bit lines BL0 to BL7 reach the read potentials, the ferroelectric memory turns on the switch SW2.

FIGS. 34 and 35 show polarization changes of the memory cells (selected memory cells) of the first and second cell regions in the period t1 respectively. As shown in FIG. 34, the memory cells of the first cell regions having stored the data "0" are polarization-inverted again due to application of a voltage (Vcc+Vr0a−Vr0). According to the fourth embodiment, the following relation holds between Vr0a and Vr0:

$$Vr0a \approx Vr0$$

Hence, $$Vcc+Vr0a-Vr0=Vcc$$

Therefore, the data "0" are rewritten in the memory cells of the first cell regions having stored the data "0". As shown in FIG. 35, a voltage (Vcc+Vr1a−Vr1) is applied to the memory cells of the second cell regions having stored the data "1" in the period t1. According to the fourth embodiment, the following relation holds between Vr1a and Vr1:

$$Vr1a < Vr1$$

The memory cells of the second cell regions having held the data "1" are polarization-inverted to polarization states shown in FIG. 35 (period t1). Thereafter the data "1" having been stored in the memory cells of the second cell regions are destroyed in a period T1 other than the period t1 through application of the voltage Vcc, so that data "0" are written therein.

After the bit lines BL0 to BL7 reach the read potentials in the period t1, the ferroelectric memory turns off the switch SW2 so that the node ND1 of the chopper comparator 20 (see FIG. 32) corresponding to the memory cells of the second cell regions having held the data "1" is booted from VT to the read potential (VT−Vr1a+Vr1). In other words, the potential of the node ND1 exceeds the logical threshold potential VT of the inverter circuit 21 (see FIG. 32) due to the following relation:

$$Vr1a < Vr1$$

Further, the node ND1 of the chopper comparator 20 corresponding to the memory cells of the first cell regions having stored the data "0" reaches the read potential (VT−Vr0a+Vr0). In other words, the potential of the node ND1 approaches the logical threshold potential VT of the inverter circuit 21 due to the following relation:

$$Vr0a = Vr0$$

The ferroelectric memory turns on the off-state switch SW3 at the same timing or in a delay of several nsec. to several 10 sec. from the timing for turning on the switch SW2. Thus, the node ND1 and the resistor R1 having the grounded first terminal are electrically connected with each other so that the potential of the node ND1 drops. As hereinabove described, the resistance value of the resistor R1 is so set that the potential drop of the node ND1 is larger than 0 V and smaller than (−Vr1a+Vr1). Therefore, the potential of the node ND1 of the chopper comparator 20 corresponding to the memory cells of the second cell regions having stored the data "1" is held in excess of the logical threshold potential VT of the inverter circuit 21. On the other hand, the potential of the node ND1 of the chopper comparator 20 corresponding to the memory cells of the first cell regions having stored the data "0" is smaller than the logical threshold potential VT of the inverter circuit 21. Thus, the chopper comparator 20 corresponding to the memory cells of the second cell regions having stored the data "1" outputs a low-level potential due to the function of the inverter circuit 21. On the other hand, the chopper comparator 20 corresponding to the memory cells of the first cell regions having stored the data "0" outputs a high-level potential due to the function of the inverter circuit 21. According to the fourth embodiment, the ferroelectric memory determines the data "0" or "1" through the current output from the chopper comparator 20.

Thereafter the ferroelectric memory sets the potentials of all bit lines BL0 to BL7 to VT. This period corresponds to a period T1 other than the period t1.

Polarization states of the memory cells of the first and second cell regions after termination of the period T1 are similar to those in the first embodiment shown in FIGS. 7 and 8 respectively. The ferroelectric memory performs the rewrite operation (periods T2 and T3) similarly to the ferroelectric memory according to the first embodiment, thereby rewriting the data "1" destroyed through the read operation in the memory cells of the second cell regions. The ferroelectric memory may turn the switches SW1 and SW3 on and off respectively at any timing after determining the data "0" or "1".

Figure 36:
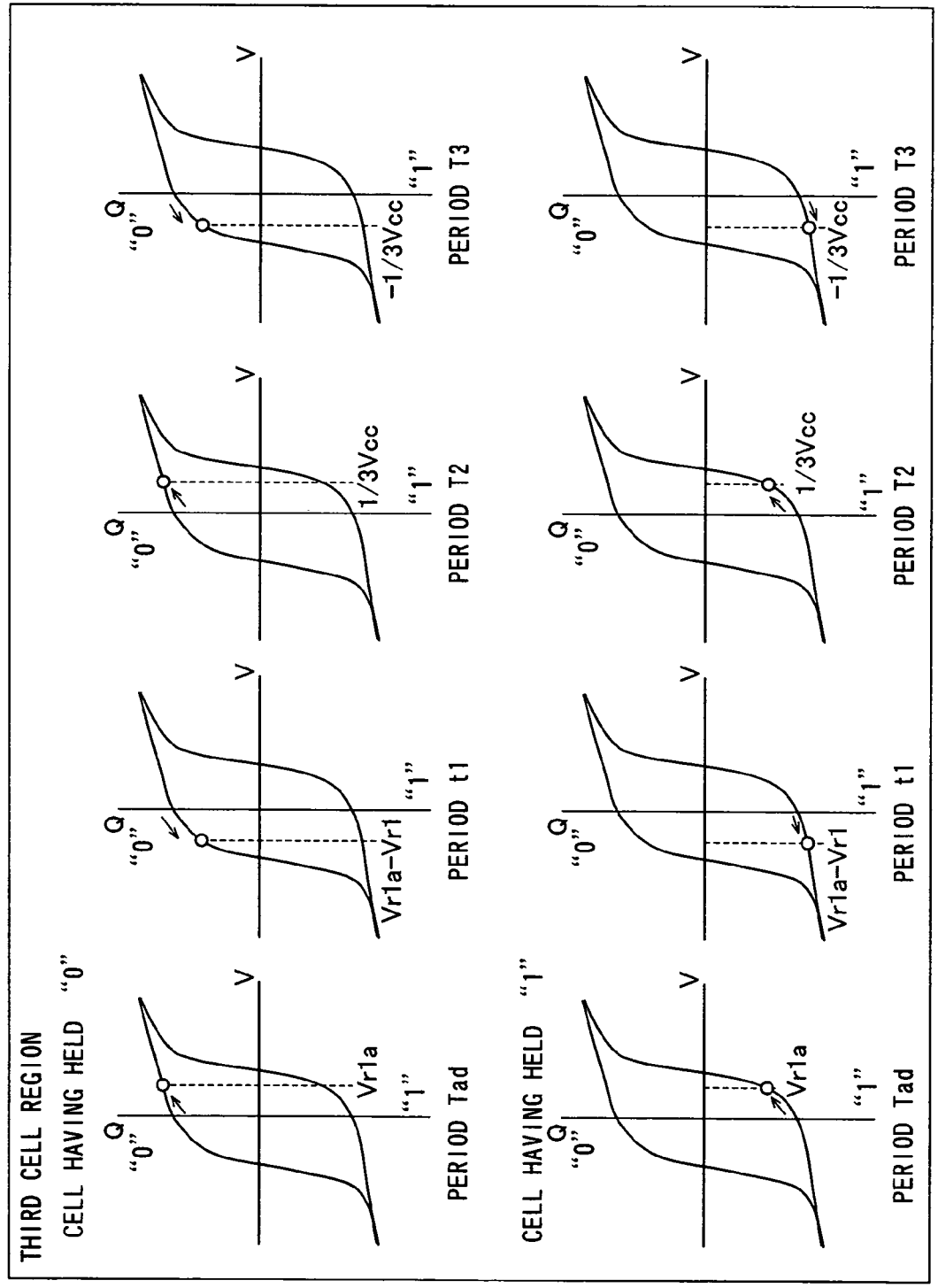
Figure 37:
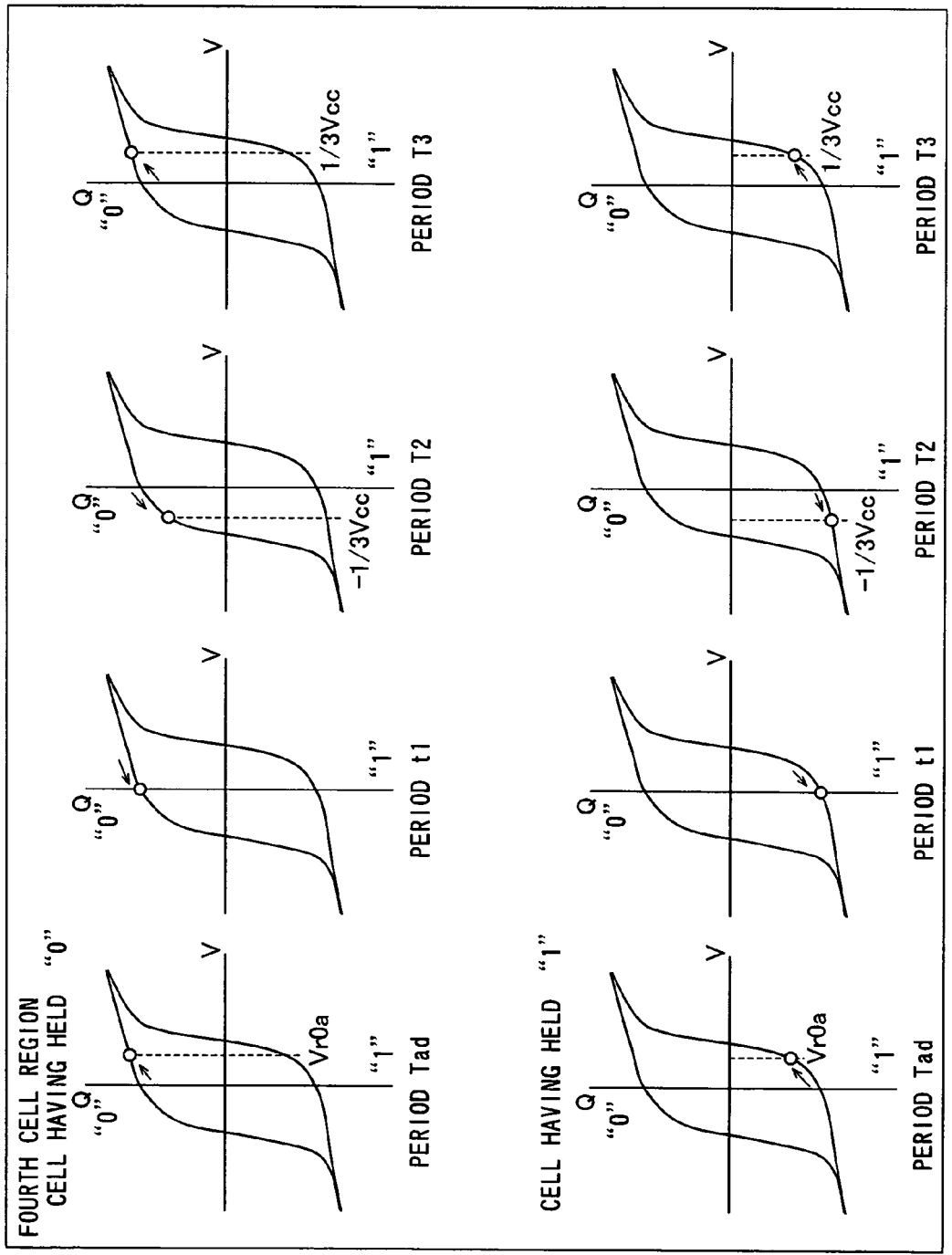
Figure 38:
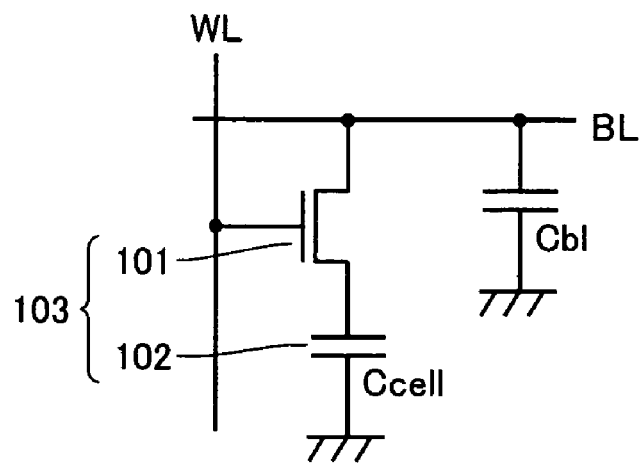
FIG. 38 is an equivalent circuit diagram showing the structure of each memory cell of a conventional DRAM.
Figure 39:
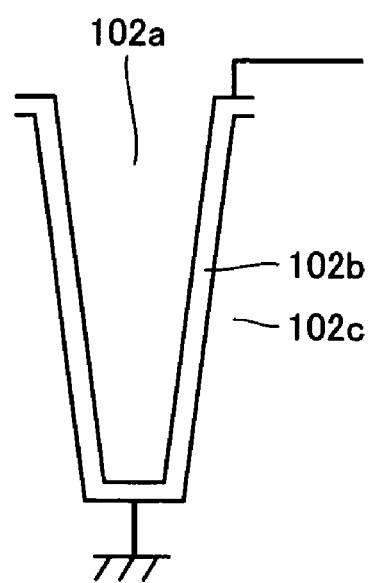
FIG. 39 is a sectional view showing the structure of a trench-type capacitor employed for the conventional DRAM.
Figure 40:
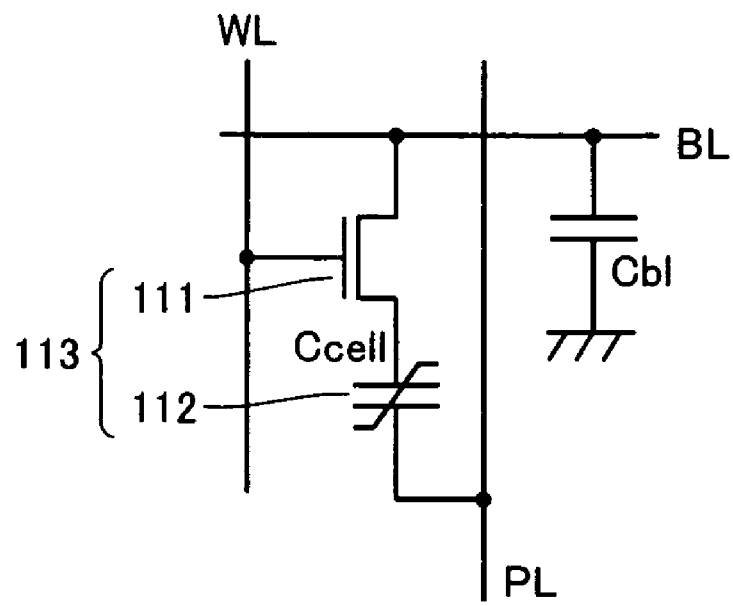
FIG. 40 is an equivalent circuit diagram showing memory cells of a one-transistor one-capacitor ferroelectric memory.

As to polarization changes of the memory cells (nonselected memory cells) of the third and fourth cell regions in the periods Tad, t1 (T1), T2 and T3, the polarization states are improved or deteriorated in response to the contents of stored data as shown in FIGS. 36 and 37 respectively. As shown in FIG. 36, the ferroelectric memory applies voltages Vr1a and (Vr1a−Vr1) to the memory cells of the third cell regions in the periods Tad and t1 (T1) respectively while applying voltages ⅓ Vcc and −⅓ Vcc thereto in the periods T2 and T3 respectively. The voltages Vr1a and (Vr1a−Vr1) are examples of the "second voltage" and the "first voltage" in the present invention respectively. When the memory cells of the third cell regions have held the data "0", therefore, the polarization states are improved and deteriorated in the periods Tad and t1 (T1) respectively, and also improved and deteriorated in the periods T2 and T3 respectively. When the memory cells of the third cell regions have held the data "1", on the other hand, the polarization states are deteriorated and improved in the periods Tad and t1 (T1) respectively, and also deteriorated and improved in the periods T2 and T3 respectively. Thus, the polarization states of the memory cells of the third cell regions are improved and deteriorated by the same frequencies throughout the periods Tad, t1 (T1), T2 and T3.

As shown in FIG. 37, the ferroelectric memory applies the voltage Vr0a to the memory cells of the fourth cell regions in the period Tad, and applies the voltages −⅓ Vcc and ⅓ Vcc thereto in the periods T2 and T3 respectively. The voltage (Vr0a−Vr1) applied to the memory cells of the fourth cell regions in the period t1 (T1) is 0 V due to the following relation:

$$Vr0a = Vr0$$

The voltage Vr0a is an example of the "second voltage" in the present invention. When the memory cells of the fourth cell regions have held the data "0", therefore, the polarization states are improved in the period Tad, and deteriorated and improved in the periods T2 and T3 respectively. When the memory cells of the fourth cell regions have held the data "1", on the other hand, the polarization states are deteriorated in the period Tad, and improved and deteriorated in the periods T2 and T3 respectively. Thus, the polarization states of the memory cells of the fourth cell regions are improved and deteriorated by the same frequencies throughout the periods T2 and T3. In the period t1 (T1), on the other hand, the polarization states of the memory cells of the fourth cell regions remain unchanged.

According to the fourth embodiment, as hereinabove described, the ferroelectric memory, bringing the potentials of all bit lines BL0 to BL7 from VT (standby state) into floating states and converting the potential of the selected word line WL3 from VT (standby state) to (VT−Vcc) in the period Tad while bringing all bit lines BL0 to BL7 into floating states and setting the potential of the selected word line WL3 to (VT+Vcc) in the period t1 thereby generating the read potential (VT−Vr1a+Vr1) (data "1") or (VT−Vr0a+Vr0) (data "0") on the bit lines BL0 to BL7 while dropping the read potentials (VT−Vr1a+Vr1) and (VT−Vr0a+Vr0) by prescribed quantities, can keep the read potential (VT−Vr1a+Vr1) in excess of the logical threshold potential VT of the inverter circuit 21 and reduce the read potential (VT−Vr0a+Vr0) below the logical threshold potential VT of the inverter circuit 21. Thus, the ferroelectric memory capable of self-determining data by comparing the read potentials (VT−Vr1a+Vr1) (data "1") and (VT−Vr0a+Vr0) (data "0") with the logical threshold potential VT of the inverter circuit 21 requires no reference voltage. Further, the ferroelectric memory applies the voltage Vr1a of polarity reverse to that of the voltage (Vr1a−Vr1) applied to the memory cells of the third cell regions in the read operation to the memory cells (nonselected memory cells) of the third cell regions in the period Tad, whereby the polarization states of the memory cells of the third cell regions can be improved also when the same are deteriorated due to application of the voltage (Vr1a−Vr1) in the read operation. Consequently, the ferroelectric memory may not separately generate a reference voltage, and can suppress disturbance. Further, the ferroelectric memory, capable of self-determining data also when cell characteristics are dispersed, can suppress influence by dispersion of the cell characteristics as compared with a case of determining data through comparison with a reference voltage.

Although the present invention has been described and illustrated in detail, it is clearly understood that the same is by way of illustration and example only and is not to be taken by way of limitation, the spirit and scope of the present invention being limited only by the terms of the appended claims.

For example, while the first to fourth embodiments of the present invention have been described with reference to ferroelectric memories as examples of the inventive memory, the present invention is not restricted to this but is also applicable to a memory other than the ferroelectric memory.

While the ferroelectric memory according to each of the aforementioned first to fourth embodiments drives the nonselected word lines or all bit lines thereby applying the voltage of polarity reverse to that of the voltage applied to the nonselected memory cells in the read operation to the nonselected memory cells in the period Tad, the present invention is not restricted to this but the ferroelectric memory may alternatively drive all selected and nonselected word lines thereby applying the voltage of polarity reverse to that of the voltage applied to the nonselected memory cells in the read operation to the nonselected memory cells in the period Tad.

While the period Tad is provided between the periods T1 and T2 or before the period T1 in each of the aforementioned first to fourth embodiments, the present invention is not restricted to this but a similar effect can be attained also when the period Tad is provided between the periods T2 and T3 or after the period T3.

What is claimed is:

1. A memory comprising:
   a memory cell array including bit lines, word lines arranged to intersect with said bit lines and memory cells connected between said bit lines and said word lines for holding first data or second data,
   applying a second voltage of polarity reverse to that of a first voltage applied to nonselected said memory cell in a read operation to at least nonselected said memory cell in addition to said read operation collectively performed on all said memory cells connected to selected said word line.

2. The memory according to claim 1, applying said first voltage and said second voltage of polarity reverse to that of said first voltage to at least nonselected said memory cell by the same frequencies throughout said read operation and a rewrite operation of rewriting read data.

3. The memory according to claim 2, wherein said rewrite operation consists of a plurality of operations.

4. The memory according to claim 3, wherein said rewrite operation includes a pair of first and second periods,
   said memory cell applying a voltage of polarity reverse to that of a voltage applied to nonselected said memory cell in said first period of said rewrite operation to nonselected said memory cell in said second period of said rewrite operation.

5. The memory according to claim 1, applying said second voltage of polarity reverse to that of said first voltage applied to nonselected said memory cell in said read operation to nonselected said memory cell by driving any of nonselected said word line, all said bit lines connected to selected said memory cell and all selected and nonselected said word lines.

6. The memory according to claim 5, applying said second voltage of polarity reverse to that of said first voltage applied to nonselected said memory cell in said read operation to said nonselected memory cell by driving nonselected said word line.

7. The memory according to claim 5, applying said second voltage of polarity reverse to that of said first voltage applied to nonselected said memory cell in said read operation to nonselected said memory cell by driving all said bit lines connected to selected said memory cell.

8. The memory according to claim 1, wherein said second voltage is set to a value capable of substantially recovering a reduced quantity of polarization when the quantity of polarization is reduced due to application of said first voltage to nonselected said memory cell.

9. The memory according to claim 8, wherein said second voltage is smaller than a voltage generated in said bit line from which said first data has been read in said read operation and larger than a voltage generated in said bit line from which said second data has been read in said read operation.

10. The memory according to claim 1, wherein said second voltage includes:
    a third voltage applied to nonselected said memory cell connected to said bit line from which said first data has been read in said read operation, and
    a fourth voltage applied to nonselected said memory cell connected to said bit line from which said second data has been read in said read operation.

11. The memory according to claim 10, applying said third voltage to nonselected said memory cell connected to said bit line from which said first data has been read in said read operation by driving said bit line from which said first data has been read in said read operation while applying said fourth voltage to nonselected said memory cell connected to said bit line from which said second data has been read in said read operation by driving said bit line from which said second data has been read in said read operation.

12. The memory according to claim 10, wherein said third voltage is substantially identical to a voltage applied in said read operation to nonselected said memory cell connected to said bit line from which said first data has been read in said read operation, and
    said fourth voltage is substantially identical to a voltage applied in said read operation to nonselected said memory cell connected to said bit line from which said second data has been read in said read operation.

13. The memory according to claim 12, wherein
a quantity of polarization recovered by application of said third voltage to nonselected said memory cell connected to said bit line from which said first data has been read is substantially identical to a quantity of polarization reduced by application of said first voltage to nonselected said memory cell connected to said bit line from which said first data has been read, and
a quantity of polarization recovered by application of said fourth voltage to nonselected said memory cell connected to said bit line from which said second data has been read is substantially identical to a quantity of polarization reduced by application of said first voltage to nonselected said memory cell connected to said bit line from which said second data has been read.

14. The memory according to claim 1, applying said second voltage to nonselected said memory cell in advance of said read operation.

15. The memory according to claim 14, bringing all said bit lines into floating states and applying a voltage for reading said first data and said second data to selected said word line immediately after applying said second voltage to nonselected said memory cell in said read operation.

16. The memory according to claim 14, bringing all said bit lines into floating states from an initial state, applying said second voltage to nonselected said memory cell by applying a fifth voltage for reading to selected said word line, thereafter bringing all said bit lines into floating states and applying a sixth voltage for reading to selected said word line in said read operation,
for reading data on the basis of a voltage generated in said bit lines after application of said sixth voltage and a voltage of said bit lines in said initial state.

17. The memory according to claim 16, further comprising a chopper comparator, connected to said bit lines, having a prescribed logical threshold voltage and reading said data, wherein
said chopper comparator determines said data on the basis of said logical threshold voltage and a read voltage generated in said bit lines.

18. The memory according to claim 1, applying said second voltage to nonselected said memory cell after said read operation.

19. The memory according to claim 1, wherein
a period for applying said second voltage to nonselected said memory cell is substantially identical to a period for applying said first voltage to nonselected said memory cell.

20. The memory according to claim 1, wherein
said memory cells include ferroelectric capacitors.

* * * * *